(12) United States Patent
Xu et al.

(10) Patent No.: US 11,974,482 B2
(45) Date of Patent: Apr. 30, 2024

(54) DISPLAY SUBSTRATE AND RELATED DEVICES

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Qian Xu, Beijing (CN); Tong Niu, Beijing (CN); Yan Huang, Beijing (CN); Guomeng Zhang, Beijing (CN); Chang Luo, Beijing (CN); Jianpeng Wu, Beijing (CN); Peng Xu, Beijing (CN); Fengli Ji, Beijing (CN); Yi Zhang, Beijing (CN); Benlian Wang, Beijing (CN); Ming Hu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 448 days.

(21) Appl. No.: 17/435,917

(22) PCT Filed: Nov. 30, 2020

(86) PCT No.: PCT/CN2020/132838
§ 371 (c)(1),
(2) Date: Sep. 2, 2021

(87) PCT Pub. No.: WO2022/110169
PCT Pub. Date: Jun. 2, 2022

(65) Prior Publication Data
US 2022/0238610 A1    Jul. 28, 2022

(51) Int. Cl.
*H10K 59/35* (2023.01)

(52) U.S. Cl.
CPC .................................. *H10K 59/353* (2023.02)

(58) Field of Classification Search
CPC ........................... H10K 59/353; H10K 59/352
See application file for complete search history.

(56) References Cited

U.S. PATENT DOCUMENTS 10,283,086 B1 * 5/2019 Su ............................. G09G 5/02
11,342,384 B2 * 5/2022 Wang ................... H10K 71/164
(Continued)

*Primary Examiner* — Mamadou L Diallo
(74) *Attorney, Agent, or Firm* — Muncy, Geissler, Olds & Lowe, P.C.

(57) ABSTRACT

A display substrate and related devices are provided. The display substrate includes a plurality of first sub-pixels, second sub-pixels and third sub-pixels. In a first direction, the first sub-pixels and the third sub-pixels are arranged alternately to form a plurality of first sub-pixel rows, the second sub-pixels form a plurality of second sub-pixel rows, the first sub-pixel rows and the second sub-pixel rows are arranged alternately in a second direction, connection lines of center points of two first sub-pixels and two third sub-pixels form a first virtual quadrilateral, the two first sub-pixels are located at two vertex angles of the first virtual quadrilateral which are opposite to each other, one second sub-pixel is located within the first virtual quadrilateral, and the first virtual quadrilateral includes two interior angles each being equal to 90° and two interior angles each being not equal to 90°.

20 Claims, 9 Drawing Sheets

(56) References Cited

U.S. PATENT DOCUMENTS

| | | | |
|---|---|---|---|
| 11,812,648 B2* | 11/2023 | Hu | H10K 59/353 |
| 2017/0169748 A1* | 6/2017 | Chen | G09G 3/3225 |
| 2018/0247984 A1* | 8/2018 | Wang | H10K 59/352 |
| 2019/0252469 A1* | 8/2019 | Xiao | H10K 59/122 |
| 2020/0357322 A1* | 11/2020 | Wu | H10K 59/353 |
| 2020/0402442 A1* | 12/2020 | Liu | G09G 3/2003 |
| 2020/0402444 A1* | 12/2020 | Yang | G09G 3/3607 |
| 2021/0098540 A1* | 4/2021 | Chen | H10K 59/352 |
| 2022/0208890 A1* | 6/2022 | Liu | H10K 50/15 |
| 2022/0208891 A1* | 6/2022 | Liu | H10K 59/353 |
| 2023/0058293 A1* | 2/2023 | Liu | G09G 5/04 |

* cited by examiner

DISPLAY SUBSTRATE AND RELATED DEVICES

CROSS-REFERENCE TO RELATED APPLICATION

This application is the U.S. national phase of PCT Application No. PCT/CN2020/132838 filed on Nov. 30, 2020, the disclosure of which is incorporated in its entirety by reference herein.

TECHNICAL FIELD

The present disclosure relates to the field of display technology, in particular to a display substrate, an organic electroluminescence display panel, a high-precision metal mask and a display device.

BACKGROUND

An Organic Light Emitting Diode (OLED) display device is one of hot spots in the research field of flat panel display. As compared with a liquid crystal display, the OLED display device has such advantages as low energy consumption, low production cost, self-luminescence, wide viewing angle and fast response speed. At present, in the field of flat panel display, a conventional liquid crystal display (LCD) has begun to be replaced with the OLED display device.

A structure of the OLED display device mainly includes a base substrate and pixels arranged in a matrix form on the base substrate. Generally, in each pixel, an organic electroluminescent structure is formed at a corresponding pixel position on the array substrate by using an organic material through vapor deposition technology with a high-precision metal mask.

A size of each opening in the high-precision metal mask directly determines a size of a sub-pixel. However, due to a limitation of a manufacturing process of the high-precision metal mask, it is difficult to acquire a high-resolution display device based on a conventional display substrate.

SUMMARY

A display substrate, an organic electroluminescence display panel, a high-precision metal mask and a display device are provided in the present disclosure, so as to improve a resolution of the display device.

In order to solve the above technical problem, the present disclosure is implemented as follows.

In a first aspect, a display substrate is provided, including a plurality of first sub-pixels, a plurality of second sub-pixels and a plurality of third sub-pixels. In a first direction, the first sub-pixels and the third sub-pixels are arranged alternately to form a plurality of first sub-pixel rows, the second sub-pixels form a plurality of second sub-pixel rows, the first sub-pixel rows and the second sub-pixel rows are arranged alternately in a second direction, connection lines of center points of two first sub-pixels and two third sub-pixels arranged in two adjacent rows and two adjacent columns form a first virtual quadrilateral, the two first sub-pixels are located at two vertex angles of the first virtual quadrilateral which are opposite to each other, one second sub-pixel is located within the first virtual quadrilateral, the first virtual quadrilateral includes two interior angles each being equal to 90° and two interior angles each being not equal to 90°, and the two interior angles each being not equal to 90° include a first interior angle and a second interior angle. In a same first virtual quadrilateral, a distance between a center point of a first sub-pixel located at the first interior angle and a center point of a third sub-pixel located at the second interior angle on a first straight line is x, the first straight line is perpendicular to a common side of the two interior angles each being equal to 90°, a value range of the first interior angle a is (h−10°, h+10°), and h is calculated through one of the following formulas $$h = 90° - \arctan\left(\frac{x}{P}\right);$$

$$h = 90° + \arctan\left(\frac{x}{P}\right);$$

where P is a distance between center points of two adjacent second sub-pixels in each second sub-pixel row.

In some embodiments, x ranges from 1 μm to 10 μm.

In some embodiments, the first interior angle a is larger than or equal to 70° and smaller than 90°.

In some embodiments, a connection line of center points of two adjacent first sub-pixels in the first direction is parallel to the first direction, a connection line of center points of two adjacent third sub-pixels in the first direction is parallel to the first direction, and a connection line of center points of the first sub-pixel and the third sub-pixel adjacent to each other in the second direction is parallel to the second direction.

In some embodiments, a distance between the two adjacent first sub-pixels in the first direction is equal to a distance between two adjacent first sub-pixels in the second direction; and/or a distance between the two adjacent third sub-pixels in the first direction is equal to a distance between two adjacent third sub-pixels in the second direction.

In some embodiments, the first direction is approximately perpendicular to the second direction, the first direction is one of a row direction and a column direction, and the second direction is the other of the row direction and the column direction.

In some embodiments, four first virtual quadrilaterals arranged in two columns and two rows form a second virtual polygon with shared sides, the second virtual polygon includes four second sub-pixels, five first sub-pixels and four third sub-pixels, the four second sub-pixels are located within the four first virtual quadrilaterals respectively, one of the five first sub-pixels is surrounded by the other four first sub-pixels, the other four first sub-pixels and the four third sub-pixels are located on sides or vertex angles of the second virtual polygon respectively, and along the sides of the second virtual polygon in both a clockwise sequence and a counterclockwise sequence, the other four first sub-pixels and the four third sub-pixels located on the sides or vertex angles of the second virtual polygon respectively are arranged alternately. Or, the second virtual polygon includes four second sub-pixels, five third sub-pixels and four first sub-pixels, the four second sub-pixels are located within the four first virtual quadrilaterals respectively, one of the five third sub-pixels is surrounded by the other four third sub-pixels, the other four third sub-pixels and the four first sub-pixels are located on sides or vertex angles of the second virtual polygon respectively, and along the sides of the second virtual polygon in both a clockwise sequence and a counterclockwise sequence, the other four third sub-pixels and the four first sub-pixels located on the sides or vertex angles of the second virtual polygon respectively are arranged alternately.

In some embodiments, a center point of the first sub-pixel surrounded by the other four first sub-pixels does not coincide with a center point of a quadrilateral formed by the other four first sub-pixels, a center point of the third sub-pixel surrounded by the other four third sub-pixels does not coincide with a center point of a quadrilateral formed by the other four third sub-pixels.

In some embodiments, the display substrate further includes a plurality of pixel repetition units, each pixel repetition unit includes two first sub-pixels and two third sub-pixels located in the same first virtual quadrilateral, and four second sub-pixels located in a same second virtual polygon as one of the two first sub-pixels and surrounding the one of the two first sub-pixels.

In some embodiments, the second virtual polygon is a rectangle.

In some embodiments, a connection line of center points of at least part of the second sub-pixels arranged in the first direction is approximately parallel to the first direction, and a connection line of center points of at least part of the second sub-pixels arranged in the second direction is approximately parallel to the second direction.

In some embodiments, each of the second sub-pixels has a same shape and a same area.

In some embodiments, in at least one first virtual quadrilateral, a distance between the second sub-pixel and one of the two third sub-pixels is L1, a distance between the second sub-pixel and the other of the two third sub-pixels is L2, and a distance between the second sub-pixel and each of the two first sub-pixels is L1. Or, in at least one first virtual quadrilateral, a distance between the second sub-pixel and each of the two third sub-pixels and a distance between the second sub-pixel and each of the two first sub-pixels is L1. Or, in at least one first virtual quadrilateral, a distance between the second sub-pixel and each of the two third sub-pixels is L1, a distance between the second sub-pixel and one of the two first sub-pixels is L1, and a distance between the second sub-pixel and the other of the two first sub-pixels is L2. Or, in at least one first virtual quadrilateral, a distance between the second sub-pixel and each of the two third sub-pixels is L2, and a distance between the second sub-pixel and each of the two first sub-pixels is L1; where L2 is larger than L1, and a spacing between sub-pixels is a minimum distance between sides of the sub-pixels.

In some embodiments, in at least one first virtual quadrilateral, a center point of the second sub-pixel does not coincide with a center point of the first virtual quadrilateral.

In some embodiments, an angle between a connection line of two adjacent second sub-pixels in the second direction and the second direction is larger than or equal to 0° and smaller than 90°.

In some embodiments, two adjacent first virtual quadrilaterals in the second direction include a first virtual quadrilateral A and a first virtual quadrilateral B. In the first virtual quadrilateral A, a distance between a center point of the second sub-pixel and a center point of the first sub-pixel adjacent to the second sub-pixel is R1, and a distance between the center point of the second sub-pixel and a center point of the third sub-pixel adjacent to the second sub-pixel is R3. In the first virtual quadrilateral B, a distance between a center point of the second sub-pixel and a center point of the first sub-pixel adjacent to the second sub-pixel is R2, and a distance between the center point of the second sub-pixel and a center point of the third sub-pixel adjacent to the second sub-pixel is R4. R1 is not equal to R2, and/or, R3 is not equal to R4.

In some embodiments, two adjacent first virtual quadrilaterals in the second direction include a first virtual quadrilateral A and a first virtual quadrilateral B, the first virtual quadrilateral A includes a first side and a third side that are parallel to the second direction, the first virtual quadrilateral B includes a second side and a fourth side that are parallel to the second direction, the first side and the second side are on a same straight line, the third side and the fourth side are on a same straight line, a length of the first side is smaller than a length of the second side, a length of the fourth side is smaller than a length of the third side, the length of the first side is equal to the length of the fourth side, and the length of the second side is equal to the length of the third side.

In some embodiments, two adjacent first virtual quadrilaterals in the second direction include a first virtual quadrilateral A and a first virtual quadrilateral B. In the first virtual quadrilateral A, a distance between the second sub-pixel and each of the two first sub-pixels is L3, and a distance between the second sub-pixel and each of the two third sub-pixels is L4. In the first virtual quadrilateral B, a distance between the second sub-pixel and each of the two first sub-pixels is L3, and a distance between the second sub-pixel and each of the two third sub-pixels is L4. A spacing between sub-pixels is a minimum distance between sides of the sub-pixels.

In some embodiments, a center point of the first sub-pixel and a center point of the third sub-pixel in an nth first sub-pixel row are located on a same straight line, and a center point of the first sub-pixel and a center point of the third sub-pixel in an (n+1)th first sub-pixel row are not located on a same straight line.

In some embodiments, in the (n+1)th first sub-pixel row, center points of all the first sub-pixels are located on a second straight line, center points of all the third sub-pixels are located on a third straight line, and the second straight line and the third straight line are different straight lines.

In some embodiments, in the second direction perpendicular to the first direction, a center point of the first sub-pixel and a center point of the third sub-pixel in a same sub-pixel column as the first sub-pixel are located on a same straight line.

In some embodiments, each of the first sub-pixels has a same shape and a same area, and each of the third sub-pixels has a same shape and a same area.

In some embodiments, an area of one first sub-pixel is S, an area of one second sub-pixel is f*S, and an area of one third sub-pixel is g*S, where $0.5 \leq f \leq 0.8$, and $1 \leq g \leq 2.2$.

In some embodiments, a shape of each of the first sub-pixels, the second sub-pixels and the third sub-pixels includes any one of a polygon, a circle or an ellipse.

In some embodiments, a shape of each of the first sub-pixels, the second sub-pixels and the third sub-pixels is any one of a quadrilateral, a pentagon, a hexagon, an octagon, a quadrilateral having a rounded corner, a hexagon having a rounded corner, an octagon having a rounded corner, a circle or an ellipse.

In some embodiments, the first sub-pixels are each a red sub-pixel, the third sub-pixels are each a blue sub-pixel, and the second sub-pixels are each a green sub-pixel; or, the first sub-pixels are each a blue sub-pixel, the third sub-pixels are each a red sub-pixel, and the second sub-pixels are each a green sub-pixel; or, the first sub-pixels are each a green sub-pixel, the third sub-pixels are each a red sub-pixel, and the second sub-pixels are each a blue sub-pixel; or, the first sub-pixels are each green sub-pixel, and the third sub-pixels are each a blue sub-pixel, and the second sub-pixels are each a blue sub-pixel.

An organic electroluminescence display panel is further provided, including the above-mentioned display substrate.

In some embodiments, the organic electroluminescence display panel further includes a pixel definition layer. The pixel definition layer includes a plurality of pixel definition layer openings, each of the first sub-pixels, the second sub-pixels and the third sub-pixels corresponds to one pixel definition layer opening, and each of the first sub-pixels, the second sub-pixels and the third sub-pixels has an approximately same shape as the corresponding pixel definition layer opening.

In some embodiments, each first sub-pixel includes multiple film layers, and the multiple film layers of the first sub-pixel at least partially cover a region outside the corresponding pixel definition layer opening; and/or, each second sub-pixel includes multiple film layers, and the multiple film layers of the second sub-pixel at least partially cover a region outside the corresponding pixel definition layer opening; and/or, each third sub-pixel includes multiple film layers, and the multiple film layers of the third sub-pixel at least partially cover a region outside the corresponding pixel definition layer opening.

A display device is further provided, including the above-mentioned organic electroluminescence display panel.

A high-precision metal mask for manufacturing the above-mentioned display substrate is further provided, including: a plurality of opening regions. The plurality of opening regions include a first opening region corresponding to a position of each first sub-pixel, a second opening region corresponding to a position of each second sub-pixel, and a third opening region corresponding to a position of each third sub-pixel.

In some embodiments, each first sub-pixel includes multiple film layers, each second sub-pixel includes multiple film layers, each third sub-pixel includes multiple film layers, a shape and an arrangement of the first opening region are approximately the same with a shape and an arrangement of at least one film layer in the first sub-pixel respectively, a shape and an arrangement of the third opening region are approximately the same with a shape and an arrangement of at least one film layer in the third sub-pixel respectively, and a shape and an arrangement of the second opening region are approximately the same with a shape and an arrangement of at least one film layer in the second sub-pixel respectively.

DETAILED DESCRIPTION

Figure 1:
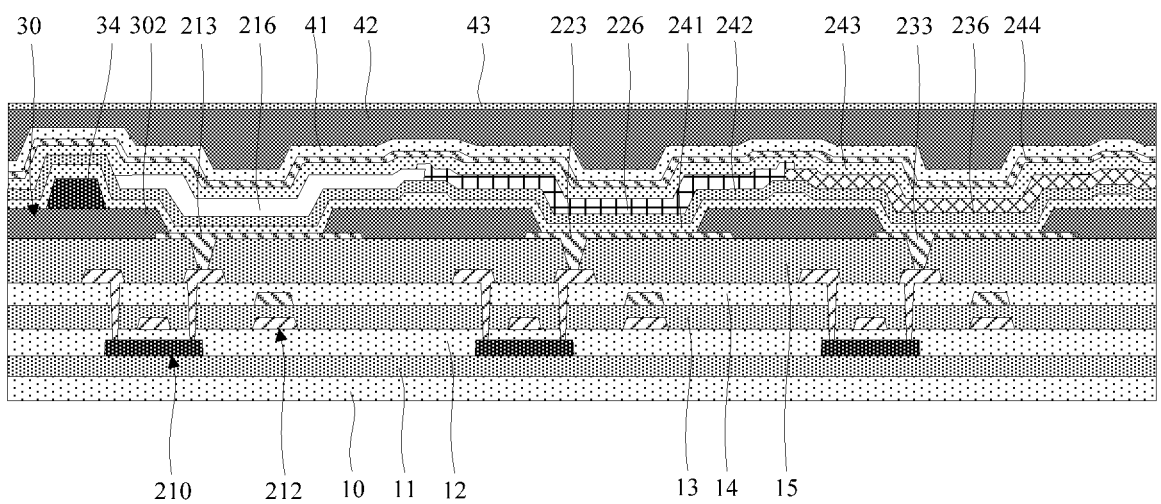
FIG. 1 is a sectional view of a display substrate according to the embodiments of the present disclosure.

In order to make the technical problems to be solved, the technical solutions and the advantages of the embodiments of the present disclosure more apparent, a detailed description will be given below with reference with the drawings and specific embodiments.

A display substrate, an organic electroluminescence display panel, a high-precision metal mask and a display device are provided in the embodiments of the present disclosure, so as to improve a resolution of the display device.

The display substrate is provided, including a plurality of first sub-pixels, a plurality of second sub-pixels and a plurality of third sub-pixels. In a first direction, the first sub-pixels and the third sub-pixels are arranged alternately to form a plurality of first sub-pixel rows, the second sub-pixels form a plurality of second sub-pixel rows, the first sub-pixel rows and the second sub-pixel rows are arranged alternately in a second direction, connection lines of center points of two first sub-pixels and two third sub-pixels arranged in two adjacent rows and two adjacent columns form a first virtual quadrilateral, the two first sub-pixels are located at two vertex angles of the first virtual quadrilateral which are opposite to each other, one second sub-pixel is located within the first virtual quadrilateral, the first virtual quadrilateral includes two interior angles each being equal to 90° and two interior angles each being not equal to 90°, and the two interior angles each being not equal to 90° include a first interior angle and a second interior angle. In a same first virtual quadrilateral, a distance between a center point of a first sub-pixel located at the first interior angle and a center point of a third sub-pixel located at the second interior angle on a first straight line is x, the first straight line is perpendicular to a common side of the two interior angles each being equal to 90°, a value range of the first interior angle a is (h−10°, h+10°), and h is calculated through one of the following formulas $$h = 90° - \arctan\left(\frac{x}{P}\right);$$

$$h = 90° + \arctan\left(\frac{x}{P}\right);$$

where P is a distance between center points of two adjacent second sub-pixels in each second sub-pixel row.

Each formula is in an approximately equal relationship, that is, the value of the first interior angle a may have a certain offset. For example, the value of the first interior angle a may range from a calculation result h minus 10° to the calculation result h plus 10°, or range from the calculation result h minus 5° to the calculation result h plus 5°.

P is the distance between the center points of the two adjacent second sub-pixels in each second sub-pixel row. The second sub-pixels in the second sub-pixel row may be distributed evenly, that is, distances between every two adjacent second sub-pixels are approximately the same, or a certain offset, e.g., which is smaller than 5 um, may exist between the distances. P may also be an average distance of distances between adjacent second sub-pixels in a same sub-pixel row. In addition, P is also approximately the same with a distance between the center point of the first sub-pixel and the center point of the third sub-pixel adjacent to the first sub-pixel in a same row. For example, an offset between P and the distance between the center point of the first sub-pixel and the center point of the third sub-pixel adjacent to the first sub-pixel in the same row is smaller than 5 um. Or, P is half a distance between center points of two adjacent first sub-pixels in a same sub-pixel row, or P is half a distance between center points of two adjacent third sub-pixels in a same sub-pixel row.

In the above scheme, as compared with a conventional display substrate, the first sub-pixels, the second sub-pixels and the third sub-pixels may be arranged closely under a same process condition in the display substrate of the embodiment of the present disclosure, so as to improve a resolution of the display device when meeting a condition of a minimum pixel spacing. In addition, the second sub-pixels are arranged in a staggered manner with respect to the first sub-pixels and the third sub-pixels. Thus, a distance between openings on a fine metal mask for manufacturing the second sub-pixels is increased under a same aperture ratio, so as to increase a margin when manufacturing the fine metal mask, thereby to achieve a higher resolution. In addition, the first sub-pixels, the second sub-pixels and the third sub-pixels are arranged in a staggered manner, so as to form a more even distribution of brightness center points, thereby to improve the display effect of the display device.

In some embodiments, one first sub-pixel includes a first effective light-emitting region, one second sub-pixel includes a second effective light-emitting region, and one third sub-pixel includes a third effective light-emitting region. An area of the second effective light-emitting region<an area of the first effective light-emitting region<an area of the third effective light-emitting region. On the display substrate, a sum of areas of all the third effective light-emitting regions included in the third sub-pixels>a sum of areas of all the second effective light-emitting regions included in the second sub-pixels>a sum of areas of all the first effective light-emitting regions included in the first sub-pixels. In some embodiments, each first effective light-emitting region, each second effective light-emitting region and each third effective light-emitting region are separated from each other. In some embodiments, each first effective light-emitting region, each second effective light-emitting region and each third effective light-emitting region are defined by a plurality of separated openings formed in a pixel definition layer. In some embodiments, each first effective light-emitting region is defined by a light-emitting layer that is driven to emit light in the corresponding first sub-pixel and locating between an anode and a cathode opposite to each other in a direction perpendicular to a base substrate. In some embodiments, each second effective light-emitting region is defined by a light-emitting layer that is driven to emit light in the corresponding second sub-pixel and locating between the anode and the cathode opposite to each other in the direction perpendicular to the base substrate. In some embodiments, each third effective light-emitting region is defined by a light-emitting layer that is driven to emit light in the corresponding third sub-pixel and locating between the anode and the cathode opposite to each other in the direction perpendicular to the base substrate. In some embodiments, each first effective light-emitting region, each second effective light-emitting region or each third effective light-emitting region is defined by the corresponding light-emitting layer and an electrode (the anode or cathode) or part of the electrode where carriers (holes or electrons) are transported in the corresponding light-emitting layer. In some embodiments, each first effective light-emitting region, each second effective light-emitting region or each third effective light-emitting region is defined by at least part of the cathode and at least part of the anode of which orthographic projections onto the base substrate overlap with each other, and the orthographic projections of the at least part of the cathode and at least part of the anode onto the base substrate do not overlap an orthographic projection of a first insulation layer onto the base substrate. The first insulation layer is located between the cathode and the anode in the direction perpendicular to the base substrate. For example, the first insulation layer includes the pixel definition layer. In some embodiments, each first sub-pixel, each second sub-pixel or each third sub-pixel includes a first electrode, the light-emitting layer located on a side of the first electrode away from the base substrate and a second electrode located on a side of the light-emitting layer away from the first electrode. In the direction perpendicular to the base substrate, a second insulation layer is further provided between the first electrode and the light-emitting layer, and/or between the second electrode and the light-emitting layer. A projection of the second insulation layer onto the base substrate overlaps a projection of the first electrode or the second electrode onto the base substrate. The second insulation layer has an opening, and the opening of the second insulation layer at a side facing the light-emitting layer may expose at least part of the first electrode or the second electrode, so as to enable the at least part of the first electrode or the second electrode to be in contact with the light-emitting layer or a functional layer used to support the light emitting. Each first effective light-emitting region, each second effective light-emitting region or each third effective light-emitting region is defined by a part of the first electrode or the second electrode that is in contact with the light-emitting layer or the functional layer used to support the light emitting. For example, the second insulation layer includes the pixel definition layer. In some embodiments, the functional layer used to support the light emitting may be any one or more of such layers as a hole injection layer, a hole transporting layer, an electron transporting layer, a hole blocking layer, an electron blocking layer, an electron injection layer, an auxiliary light-emitting layer, an interface improvement layer and an anti-reflection layer. In some embodiments, the first electrode may be the anode and the second electrode may be the cathode. In some embodiments, the first electrode may include at least two stacked layers made of indium tin oxide (ITO) and Ag respectively. For example, the first electrode may include three stacked layers made of ITO, Ag, and ITO respectively. In some embodiments, the second electrode may include any one or more of Mg, Ag, ITO, and indium zinc oxide (IZO). For example, the second electrode may be a mixed layer or an alloy layer of Mg and Ag.

Each sub-pixel includes the light-emitting layer, each first sub-pixel includes a first-color light-emitting layer located within the opening and on the pixel definition layer, each second sub-pixel includes a second-color light-emitting layer located within the opening and on the pixel definition layer, and each third sub-pixel includes a third-color light-emitting layer located within the opening and on the pixel definition layer.

In some exemplary embodiments, a manufacturing process of the display substrate in the embodiment may include the following steps (1) to (8). The exemplary embodiment is described by taking a flexible display substrate having a top-emission structure (shown in FIG. 1) as an example.

(1) Forming a Base Substrate on a Glass Support Plate

In some exemplary embodiments, the base substrate 10 may be a flexible base substrate, e.g., including a first flexible material layer, a first inorganic material layer, a semiconductor layer, a second flexible material layer and a second inorganic material layer laminated one another on the glass support plate 1. The first flexible material layer and the second flexible material layer are each made of such a material as polyimide (PI), polyethylene terephthalate (PET) or surface-treated polymer soft film. The first inorganic material layer and the second inorganic material layer are each made of such a material as silicon nitride (SiNx) or silicon oxide (SiOx), so as to improve a capability of preventing oxygen and moisture from entering the base substrate. The first inorganic material layer and the second inorganic material layer are also called barrier layers. The semiconductor layer is made of amorphous silicon (a-si). In some exemplary embodiments, taking a laminated structure of PI1/Barrier1/a-si/PI2/Barrier2 as an example, the display substrate may be manufactured as follows. First, polyimide is applied onto the glass support plate 1 and cured to form a first flexible (PI1) layer. Next, a barrier thin film is deposited on the first flexible layer to form a first barrier (Barrier1) layer covering the first flexible layer, an amorphous thin film is deposited on the first barrier layer to form an amorphous silicon (a-si) layer covering the first barrier layer, and polyimide is applied onto the amorphous silicon layer and cured to form a second flexible (PI2) layer. Then, a barrier thin film is deposited on the second flexible layer to form a second barrier (Barrier2) layer covering the second flexible layer. Finally, the manufacturing of the base substrate 10 is finished.

(2) Manufacturing a Driving Structure Layer on the Base Substrate

The driving structure layer includes multiple driving circuits. Each driving circuit includes multiple transistors and at least one storage capacitor. For example, the driving circuit may be designed to be of a 2T1C, 3T1C or 7T1C structure.

In some exemplary embodiments, the driving structure layer may be manufactured as follows, which is described by taking a manufacturing process of a driving circuit of a first sub-pixel 21 as an example.

A first insulation thin film and an active layer thin film are deposited on the base substrate 10 sequentially, and the active layer thin film is patterned through a patterning process to form a first insulation layer 11 covering the entire base substrate 10 and an active layer pattern arranged on the first insulation layer 11. The active layer pattern includes at least a first active layer.

Next, a second insulation thin film and a first metal thin film are deposited sequentially, and the first metal thin film is patterned through a patterning process to form a second insulation layer 12 covering the active layer pattern and a first gate metal layer pattern arranged on the second insulation layer 12. The first gate metal layer pattern includes at least a first gate electrode and a first capacitor electrode.

Next, a third insulation thin film and a second metal thin film are deposited sequentially, and the second metal thin film is patterned through a patterning process to form a third insulation layer 13 covering a first gate metal layer and a second gate metal layer pattern arranged on the third insulation layer 13. The second gate metal layer pattern includes at least a second capacitor electrode of which a position corresponds to a position of the first capacitor electrode.

Next, a fourth insulation thin film is deposited, and then patterned through a patterning process to form a pattern of the fourth insulation layer 14 covering a second gate metal layer. The fourth insulation layer 14 is provided with at least two first via-holes. The fourth insulation layer 14, the third insulation layer 13 and the second insulation layer 12 in the at least two first via-holes are etched off, so as to expose a surface of the first active layer.

Finally, a third metal thin film is deposited and then patterned through a patterning process to form a pattern of a source-drain metal layer on the fourth insulation layer 14. The source-drain metal layer includes at least a first source electrode and a first drain electrode in a display region. The first source electrode and the first drain electrode may be connected to the first active layer through the first via-holes respectively.

In the driving circuit of the first sub-pixel 21 in the display region, the first active layer, the first gate electrode, the first source electrode and the first drain electrode may form a first transistor 210, and the first capacitor electrode and the second capacitor electrode may form a first storage capacitor 212. In the above manufacturing process, a driving circuit of the second sub-pixel 22 and a driving circuit of the third color sub-pixel 23 may be formed simultaneously.

In some exemplary embodiments, the first insulation layer 11, the second insulation layer 12, the third insulation layer 13 and the fourth insulation layer 14 are each made of any one or more of silicon oxide (SiOx), silicon nitride (SiNx) or silicon oxynitride (SiON), and each may be of a single layer, multi-layer or composite layer structure. The first insulation layer 11 is called as a buffer layer and used to improve a capability of preventing oxygen and moisture from entering the base substrate. The second insulation layer 12 and the third insulation layer 13 are each referred to as a gate insulation (GI) layer, and the fourth insulation layer 14 is referred to as an interlayer insulation (Interlayer Dielectric, ILD) layer. The first metal thin film, the second metal thin film and the third metal thin film are each made of a metal material, such as any one or more of Ag, Cu, Al, Ti and Mo, or an alloy material thereof, such as AlNd or MoNb, and each may be of a single-layer structure or a multi-layer composite structure, such as Ti/Al/Ti. The active layer thin film may be made of any one or more of such materials as amorphous indium gallium zinc oxide (a-IGZO), zinc oxynitride (ZnON), indium zinc tin oxide (IZTO), amorphous silicon (a-Si), polysilicon (p-Si), hexathiophene or polythiophene. That is, the present disclosure is suitable for a transistor manufactured based on an oxide technology, a silicon technology and an organic technology.

(3) Forming a Planarization Layer on the Base Substrate Provided with the Aforementioned Pattern In some exemplary embodiments, a planarization thin film made of an organic material is applied onto the base substrate 10 provided with the aforementioned pattern to form a planarization (PLN) layer 15 covering the entire base substrate 10, and then exposed with a mask and developed to form a plurality of second via-holes K2 in the planarization layer 15 in the display region. During a development process, the planarization layer 15 in the plurality of second via-holes K2 is removed, so as to expose a surface of the first drain electrode of the first transistor 210 in the driving circuit of the first sub-pixel 21, a surface of a first drain electrode of a first transistor in the driving circuit of the second sub-pixel 22 and a surface of a first drain electrode of a first transistor in the driving circuit of the third sub-pixel 23.

(4) Forming a Pattern of the First Electrode on the Base Substrate Provided with the Aforementioned Pattern In some examples, the first electrode is a reflective anode.

In some exemplary embodiments, a conductive thin film is deposited on the base substrate 10 provided with the aforementioned pattern, and then patterned through a patterning process to form the pattern of the first electrode. A first anode 213 of the first sub-pixel 21 is connected to the first drain electrode of the first transistor 210 through the second via-holes K2, a second anode 223 of the second sub-pixel 22 is connected to the first drain electrode of the first transistor of the second sub-pixel 22 through the second via-holes K2, and a third anode 233 of the third sub-pixel 23 is connected to the first drain electrode of the first transistor of the third sub-pixel 23 through the second via-holes K2.

In some examples, the first electrode may made of a metal material, such as any one or more of Mg, Ag, Cu, Al, Ti or Mo, or an alloy material thereof, such as AlNd or MoNb.

The first electrode may be of a single-layer structure, a multi-layer composite structure such as Ti/Al/Ti, or a stacked structure formed by a metal material and a transparent conductive material which are such reflective materials as ITO/Ag/ITO or Mo/AlNd/ITO.

(5) Forming a Pattern of the Pixel Definition Layer (PDL) Layer on the Base Substrate Provided with the Aforementioned Pattern In some exemplary embodiments, a pixel definition thin film is applied onto the base substrate 10 provided with the aforementioned pattern, and then exposed with a mask and developed to form the pattern of the PDL layer. The pixel definition layer 30 in the display region includes a plurality of sub-pixel definition portions 302. A plurality of pixel definition layer openings 301 are formed between adjacent sub-pixel definition portions 302, and the pixel definition layer 30 in the plurality of pixel definition layer openings 301 is removed during a development process, so as to expose at least part of a surface of the first anode 213 of the first sub-pixel 21, at least part of a surface of the second anode 223 of the second sub-pixel 22 and at least part of a surface of the third anode 233 of the third sub-pixel 23.

In some examples, the pixel definition layer 30 may be made of polyimide, acrylic or polyethylene terephthalate, etc.

(6) Forming a Pattern of a Post Spacer (PS) on the Base Substrate Provided with the Aforementioned Pattern In some exemplary embodiments, an organic material thin film is applied onto the base substrate 10 provided with the aforementioned pattern, and then exposed with a mask and developed to form the pattern of the PS 34. The PS 34 may be used as a supporting layer and configured to support a fine metal mask (FMM) during an evaporation process. In some examples, along a row arrangement direction of the sub-pixels, a repetition unit is arranged between two adjacent PSs 34. For example, the PS 34 may be located between the first sub-pixel 21 and the third sub-pixel 23 adjacent to the first sub-pixel 21.

(7) Forming an Organic Functional Layer and the Second Electrode Sequentially on the Base Substrate Provided with the Aforementioned Pattern In some examples, the second electrode is a transparent cathode. Light emitted by a light-emitting element may exit at a side of the transparent cathode away from the base substrate 10, so as to achieve top emission. In some examples, the organic functional layer of the light-emitting element includes a hole injection layer, a hole transporting layer, a light-emitting layer and an electron transporting layer.

In some exemplary embodiments, the hole injection layer 241 and the hole transporting layer 242 are formed through vapor deposition sequentially using an open mask on the base substrate 10 provided with the aforementioned pattern, and then a blue light-emitting layer 236, a green light-emitting layer 216 and a red light-emitting layer 226 are formed sequentially through vapor deposition using a FMM. Next, the electron transporting layer 243, the cathode 244 and an optical coupling layer 245 are formed sequentially through vapor deposition using an open mask. All the hole injection layer 241, the hole transporting layer 242, the electron transporting layer 243 and the cathode 244 are common layers of multiple sub-pixels. In some examples, the organic functional layer may further include a microcavity adjustment layer located between the hole transporting layer and the light-emitting layer. For example, a blue microcavity adjustment layer, the blue light-emitting layer, a green microcavity adjustment layer, the green light-emitting layer, a red microcavity adjustment layer and the red light-emitting layer are formed sequentially through vapor deposition using a FMM.

In some exemplary embodiments, the organic functional layer is formed in a sub-pixel region, so as to enable the organic functional layer to be connected to the anode. The cathode is formed on the pixel definition layer and connected to the organic functional layer.

In some exemplary embodiments, the cathode may be made of any one or more of Mg, Ag, Al, or an alloy thereof, or be made of a transparent conductive material, such as ITO, or be of a multi-layer composite structure made of metal and transparent conductive materials.

In some exemplary embodiments, the optical coupling layer may be formed on a side of the cathode 244 away from the base substrate 10, and be a common layer of the multiple sub-pixels. The optical coupling layer may cooperate with the transparent cathode to output more light. For example, the optical coupling layer may be, but not limited to, made of a semiconductor material.

(8) Forming an Encapsulation Layer on the Base Substrate Provided with the Aforementioned Pattern In some exemplary embodiments, the encapsulation layer is formed on the base substrate 10 provided with the aforementioned pattern, and may include a first encapsulation layer 41, a second encapsulation layer 42 and a third encapsulation layer 43 laminated one another. The first encapsulation layer 41 is made of an inorganic material and covers the cathode 244 in the display region. The second encapsulation layer 42 is made of an organic material. The third encapsulation layer 43 is made of an inorganic material and covers the first encapsulation layer 41 and the second encapsulation layer 42. However, the embodiment is not limited thereto. In some examples, the encapsulation layer may be of a five-layer structure including one inorganic material layer, one organic material layer, one inorganic material layer, one organic material layer and one inorganic material layer arranged sequentially.

In some embodiments, x ranges from 1 μm to 10 μm. Further, x ranges from 2 μm to 7 μm, or x ranges from 2 μm to 8 μm. For example, x may be 2 μm, 3 μm, 4 μm, 5 μm, 6 μm, 7 μm or 8 μm.

In some embodiments, the first interior angle a is larger than or equal to 70° and smaller than 90°. Further, the first interior angle a is larger than or equal to 75° and smaller than 90°. For example, a value of the first interior angle a may be 86°, 82°, 83°, 84° or 85°.

In some embodiments, a connection line of center points of two adjacent first sub-pixels in the first direction is parallel to the first direction, a connection line of center points of two adjacent third sub-pixels in the first direction is parallel to the first direction, and a connection line of center points of the first sub-pixel and the third sub-pixel adjacent to each other in the second direction is parallel to the second direction.

In some embodiments, a distance between the two adjacent first sub-pixels in the first direction is equal to a distance between two adjacent first sub-pixels in the second direction; and/or a distance between the two adjacent third sub-pixels in the first direction is equal to a distance between two adjacent third sub-pixels in the second direction.

That is, connection lines of center points of the four first sub-pixels arranged in two rows and two columns form a virtual square, and connection lines of center points of the four third sub-pixels arranged in two rows and two columns form a virtual square. In this way, the first sub-pixels and the third sub-pixels are distributed evenly, so as to form the more even distribution of brightness center points, and improve the display effect of the display device.

In some embodiments, the first direction is approximately perpendicular to the second direction, the first direction is one of a row direction and a column direction, and the second direction is the other of the row direction and the column direction.

In some embodiments, four first virtual quadrilaterals arranged in two columns and two rows form a second virtual polygon with shared sides, the second virtual polygon includes four second sub-pixels, five first sub-pixels and four third sub-pixels, the four second sub-pixels are located within the four first virtual quadrilaterals respectively, one of the five first sub-pixels is surrounded by the other four first sub-pixels, the other four first sub-pixels and the four third sub-pixels are located on sides or vertex angles of the second virtual polygon respectively, and along the sides of the second virtual polygon in both a clockwise sequence and a counterclockwise sequence, the other four first sub-pixels and the four third sub-pixels located on the sides or vertex angles of the second virtual polygon respectively are arranged alternately. Or, the second virtual polygon includes four second sub-pixels, five third sub-pixels and four first sub-pixels, the four second sub-pixels are located within the four first virtual quadrilaterals respectively, one of the five third sub-pixels is surrounded by the other four third sub-pixels, the other four third sub-pixels and the four first sub-pixels are located on sides or vertex angles of the second virtual polygon respectively, and along the sides of the second virtual polygon in both a clockwise sequence and a counterclockwise sequence, the other four third sub-pixels and the four first sub-pixels located on the sides or vertex angles of the second virtual polygon respectively are arranged alternately.

Connection lines of the other four first sub-pixels located on the sides or vertex angles of the second virtual polygon form approximately a virtual parallelogram, and/or, connection lines of the four third sub-pixels located on the sides or vertex angles of the second virtual polygon form approximately a virtual parallelogram, and/or, connection lines of the four second sub-pixels located within the four first virtual quadrilaterals form approximately a virtual parallelogram.

In some embodiments, the connection lines of the other four first sub-pixels located on the sides or vertex angles of the second virtual polygon form approximately a virtual rectangle or a virtual square, the connection lines of the four third sub-pixels located on the sides or vertex angles of the second virtual polygon form approximately a virtual rectangle or a virtual square, and the connection lines of the four second sub-pixels located within the four first virtual quadrilaterals form approximately a virtual rectangle.

The first virtual quadrilaterals form a second virtual polygon with shared sides, that is, two adjacent first virtual quadrilaterals in the row direction share one side in the column direction, and two adjacent first virtual quadrilaterals in the column direction share one side in the row direction.

In some embodiments, a center point of the first sub-pixel surrounded by the other four first sub-pixels does not coincide with a center point of a quadrilateral formed by the other four first sub-pixels, a center point of the third sub-pixel surrounded by the other four third sub-pixels does not coincide with a center point of a quadrilateral formed by the other four third sub-pixels.

In some embodiments, the four first virtual quadrilaterals of a same second virtual polygon include a first virtual quadrilateral T1 and a second virtual polygon T2. A width-to-length ratio of the second sub-pixel in the first virtual quadrilateral T1 is larger than a width-to-length ratio of the second sub-pixel in the first virtual quadrilateral T2.

A length of the second sub-pixel may be a largest size of the second sub-pixel in a length direction of the second sub-pixel, and a width of the second sub-pixel may be a largest size of the second sub-pixel in a width direction of the second sub-pixel.

Or, the second sub-pixel includes two symmetry axes perpendicular to each other, and the width-to-length ratio of the second sub-pixel is a ratio of a smaller size to a larger size on the two symmetry axes.

In some embodiments, the display substrate further includes a plurality of pixel repetition units, each pixel repetition unit includes two first sub-pixels and two third sub-pixels located in the same first virtual quadrilateral, and four second sub-pixels located in a same second virtual polygon as one of the two first sub-pixels and surrounding the one of the two first sub-pixels.

In addition, a structure of each pixel repetition unit located in a peripheral region of the display substrate may be different from a structure of each pixel repetition unit located in a central region of the display substrate. That is because the pixel repetition unit located in the peripheral region of the display substrate may have fewer sub-pixels.

In some embodiments, the second virtual polygon is a rectangle.

In some embodiments, a connection line of center points of at least part of the second sub-pixels arranged in the first direction is approximately parallel to the first direction, and a connection line of center points of at least part of the second sub-pixels arranged in the second direction is approximately parallel to the second direction.

In some embodiments, some of the second sub-pixels have different shapes and/or areas. For example, some second sub-pixels each has a shape different from the other second sub-pixels, or some second sub-pixels each has an area different from the other second sub-pixels, or some second sub-pixels each has a shape and an area different from the other second sub-pixels.

In some embodiments, each of the second sub-pixels may have a same shape and a same area.

In some embodiments, in at least one first virtual quadrilateral, a distance between the second sub-pixel and one of the two third sub-pixels is L1, a distance between the second sub-pixel and the other of the two third sub-pixels is L2, and a distance between the second sub-pixel and each of the two first sub-pixels is L1. Or, in at least one first virtual quadrilateral, a distance between the second sub-pixel and each of the two third sub-pixels and a distance between the second sub-pixel and each of the two first sub-pixels are L1. Or, in at least one first virtual quadrilateral, a distance between the second sub-pixel and each of the two third sub-pixels is L1, a distance between the second sub-pixel and one of the two first sub-pixels is L1, a distance between the second sub-pixel and the other of the two first sub-pixels is L2. Or, in at least one first virtual quadrilateral, a distance between the second sub-pixel and each of the two third sub-pixels is L2, and a distance between the second sub-pixel and each of the two first sub-pixels is L1; where L2 is larger than L1, and a spacing between sub-pixels is a minimum distance between sides of the sub-pixels.

In some embodiments, along a counterclockwise direction, the four second sub-pixels in the second virtual quadrilateral are a second sub-pixel A, a second sub-pixel B, a second sub-pixel C and a second sub-pixel D, respectively.

The second sub-pixel A, the second sub-pixel B, the second sub-pixel C and the second sub-pixel D each has a same shape. Or, the second sub-pixel A has a same shape as the second sub-pixel B, the second sub-pixel C has a same shape as the second sub-pixel D, and the second sub-pixel A has a different shape from the second sub-pixel C. Or, the second sub-pixel A has a same shape as the second sub-pixel D, the second sub-pixel C has a same shape as the second sub-pixel B, and the second sub-pixel A has a different shape from the second sub-pixel C. Or, the second sub-pixel A has a same shape as the second sub-pixel C, a shape of the second sub-pixel A, a shape of the second sub-pixel B and a shape of the second sub-pixel D are different from each other. Or, the shape of the second sub-pixel A, the shape of the second sub-pixel B, a shape of the second sub-pixel C and the shape of the second sub-pixel D are different from each other.

In some embodiments, in at least one first virtual quadrilateral, a center point of the second sub-pixel does not coincide with a center point of the first virtual quadrilateral.

In some embodiments, an angle between a connection line of two adjacent second sub-pixels in the second direction and the second direction is larger than or equal to 0° and smaller than 90°.

In some embodiments, a center point of the first sub-pixel and a center point of the third sub-pixel in an nth first sub-pixel row are located on a same straight line, and a center point of the first sub-pixel and a center point of the third sub-pixel in an (n+1)th first sub-pixel row are not located on a same straight line.

In some embodiments, in the (n+1)th first sub-pixel row, center points of all the first sub-pixels are located on a second straight line, center points of all the third sub-pixels are located on a third straight line, and the second straight line and the third straight line are different straight lines.

In some embodiments, in the second direction perpendicular to the first direction, a center point of the first sub-pixel and a center point of the third sub-pixel in a same sub-pixel column as the first sub-pixel are located on a same straight line.

In some embodiments, two adjacent first virtual quadrilaterals in the second direction include a first virtual quadrilateral A and a first virtual quadrilateral B. In the first virtual quadrilateral A, a distance between a center point of the second sub-pixel and a center point of the first sub-pixel adjacent to the second sub-pixel is R1, and a distance between the center point of the second sub-pixel and a center point of the third sub-pixel adjacent to the second sub-pixel is R3. In the first virtual quadrilateral B, a distance between a center point of the second sub-pixel and a center point of the first sub-pixel adjacent to the second sub-pixel is R2, and a distance between the center point of the second sub-pixel and a center point of the third sub-pixel adjacent to the second sub-pixel is R4. R1 is not equal to R2, and/or, R3 is not equal to R4.

In some embodiments, two adjacent first virtual quadrilaterals in the second direction include a first virtual quadrilateral A and a first virtual quadrilateral B, the first virtual quadrilateral A includes a first side and a third side that are parallel to the second direction, the first virtual quadrilateral B includes a second side and a fourth side that are parallel to the second direction, the first side and the second side are on a same straight line, the third side and the fourth side are on a same straight line, a length of the first side is smaller than a length of the second side, a length of the fourth side is smaller than a length of the third side, the length of the first side is equal to the length of the fourth side, and the length of the second side is equal to the length of the third side.

In some embodiments, two adjacent first virtual quadrilaterals in the second direction include a first virtual quadrilateral A and a first virtual quadrilateral B. In the first virtual quadrilateral A, a distance between the second sub-pixel and each of the two first sub-pixels is L3, and a distance between the second sub-pixel and each of the two third sub-pixels is L4. In the first virtual quadrilateral B, a distance between the second sub-pixel and each of the two first sub-pixels is L3, and a distance between the second sub-pixel and each of the two third sub-pixels is L4. A spacing between sub-pixels is a minimum distance between sides of the sub-pixels.

Optionally, in the display substrate of the embodiment of the present disclosure, the first sub-pixels are each a red sub-pixel, the third sub-pixels are each a blue sub-pixel, and the second sub-pixels are each a green sub-pixel. Or, the first sub-pixels are each a blue sub-pixel, the third sub-pixels are each a red sub-pixel, and the second sub-pixels are each a green sub-pixel. In this way, the green sub-pixel located in the first virtual quadrilateral may form a light-emitting pixel point with the red sub-pixel and the blue sub-pixel located at any two adjacent vertex angles of the first virtual quadrilateral.

In some embodiments, the first sub-pixels may each be a green sub-pixel, the third sub-pixels may each be a red sub-pixel, and the second sub-pixels may each be a blue sub-pixel. Or, the first sub-pixels may each be green sub-pixel, the third sub-pixels may each be a blue sub-pixel, and the second sub-pixels may each be a blue sub-pixel.

Optionally, in the display substrate of the embodiment of the present disclosure, each of the first sub-pixels has a same area, so as to ensure that, in any light-emitting pixel point composed of the first sub-pixel, the second sub-pixel and the third sub-pixel, the first sub-pixel has a same light-emitting area.

Of course, during a specific implementation, in the display substrate of the embodiment of the present disclosure, an area of each of at least two first sub-pixels may be different from the other first sub-pixels, which will not be particularly defined herein.

Optionally, in the display substrate of the embodiment of the present disclosure, each of the second sub-pixels has a same area, so as to ensure that, in any light-emitting pixel point composed of the first sub-pixel, the second sub-pixel and the third sub-pixel, the second sub-pixel has a same light-emitting area.

Of course, during a specific implementation, in the display substrate of the embodiment of the present disclosure, an area of each of at least two second sub-pixels may be different from the other second sub-pixels, which will not be particularly defined herein.

Optionally, in the display substrate of the embodiment of the present disclosure, each of the third sub-pixels has a same area, so as to ensure that, in any light-emitting pixel point composed of the first sub-pixel, the second sub-pixel and the third sub-pixel, the third sub-pixel has a same light-emitting area.

Of course, during a specific implementation, in the display substrate of the embodiment of the present disclosure, an area of each of at least third second sub-pixels may be different from the other third sub-pixels, which will not be particularly defined herein.

In some embodiments, an area of one first sub-pixel is S, an area of one second sub-pixel is PS, and an area of one third sub-pixel is g*S, where 0.5≤f≤0.8, and 1≤g≤2.2. In this way, brightness center points of light-emitting pixel points each composed of the first sub-pixel, the second sub-pixel and the third sub-pixel may be distributed more evenly, so as to improve the display effect.

Further, since a luminous efficiency of the blue sub-pixel is relatively low and a life span thereof is short, optionally, in the display substrate of the embodiment of the present disclosure, an area of the blue sub-pixel may be designed to be larger than an area of the red sub-pixel and an area of the green sub-pixel.

Further, in the display substrate of the embodiment of the present disclosure, since a luminous efficiency of the green sub-pixel is generally high, the area of the green sub-pixel may be designed to be smaller than the area of the red sub-pixel. Of course, during a specific implementation, the area of the green sub-pixel may be the same with the area of the red sub-pixel, which will not be particularly defined herein.

In order to ensure that mask patterns may be consistent for a same type of pixels during manufacturing, thereby to simplify a patterning process, optionally, in the display substrate of the embodiment of the present disclosure, the first sub-pixels each has an approximately same shape.

Of course, during a specific implementation, in the display substrate of the embodiment of the present disclosure, at least two first sub-pixels each has a different shape from the other first sub-pixels, which will not be particularly defined herein.

In order to ensure that mask patterns may be consistent for a same type of pixels during manufacturing, thereby to simplify a patterning process, optionally, in the display substrate of the embodiment of the present disclosure, the second sub-pixels each has an approximately same shape.

Of course, during a specific implementation, in the display substrate of the embodiment of the present disclosure, at least two second sub-pixels each has a different shape from the other second sub-pixels, which will not be particularly defined herein.

In addition, optionally, in a second virtual parallelogram of the display substrate of the embodiment of the present disclosure, in the case that patterns of four second sub-pixel are the same or similar, arrangement angles thereof may be the same or different, which will not be particularly defined herein.

In order to ensure that mask patterns may be consistent for a same type of pixels during manufacturing, thereby to simplify a patterning process, optionally, in the display substrate of the embodiment of the present disclosure, the third sub-pixels each has an approximately same shape.

Of course, during a specific implementation, in the display substrate of the embodiment of the present disclosure, at least two third sub-pixels each has a different shape from the other third sub-pixels, which will not be particularly defined herein.

Optionally, specific shapes of the second sub-pixel, the first sub-pixel and the third sub-pixel, a positional relationship, a parallel and angular relationship among the second sub-pixel, the first sub-pixel and the third sub-pixel may be designed as required. In a practical process, due to limitations of process conditions or other factors, there may be some deviations. Therefore, the shapes and positions of the second sub-pixel, the first sub-pixel and the third sub-pixel and a relative positional relationship among the second sub-pixel, the first sub-pixel and the third sub-pixel may meet the above conditions approximately, which are also included in the display substrate of the embodiment of the present disclosure.

It should be appreciated that, when the patterns of the sub-pixels are inconsistent in the embodiments of the present disclosure, it means that shapes of the sub-pixels are different. For example, one sub-pixel is of a circular shape and the other sub-pixel is of a rectangular shape. Similarly, when the patterns of the sub-pixels are consistent in the embodiments of the present disclosure, it means that the shapes of the sub-pixels are the same or similar. For example, two sub-pixels are each of a triangular shape, and shapes of the two sub-pixels are considered to be consistent regardless of whether areas thereof are equal to each other.

In some embodiments, a shape of each of the first sub-pixels, the second sub-pixels and the third sub-pixels includes any one of a polygon, a circle or an ellipse.

In some embodiments, a shape of each of the first sub-pixels, the second sub-pixels and the third sub-pixels is any one of a quadrilateral, a pentagon, a hexagon, an octagon, a quadrilateral having a rounded corner, a hexagon having a rounded corner, an octagon having a rounded corner, a circle or an ellipse.

It should be appreciated that, in the display substrate of the embodiment of the present disclosure, when the sub-pixel is located at one position, it means that there is an overlapping region between the sub-pixel and a range of the one position where the sub-pixel is located. During a specific implementation, a center point of the sub-pixel may overlap the one position. Of course, the center point of the sub-pixel may not overlap the one position, that is, there is an offset between the center point of the sub-pixel and the one position, which will not be particularly defined herein. In addition, the center point of the sub-pixel may be a geometric center point of a sub-pixel pattern, or a center point of a light-emitting color of the sub-pixel, which will not be particularly defined herein.

Optionally, in the display substrate of the embodiment of the present disclosure, in order to ensure that the sub-pixels may be evenly distributed, the center point of each sub-pixel is close to a corresponding position as much as possible.

The technical solutions of the present disclosure will be further described below in conjunction with the drawings and specific embodiments.

Figure 2:
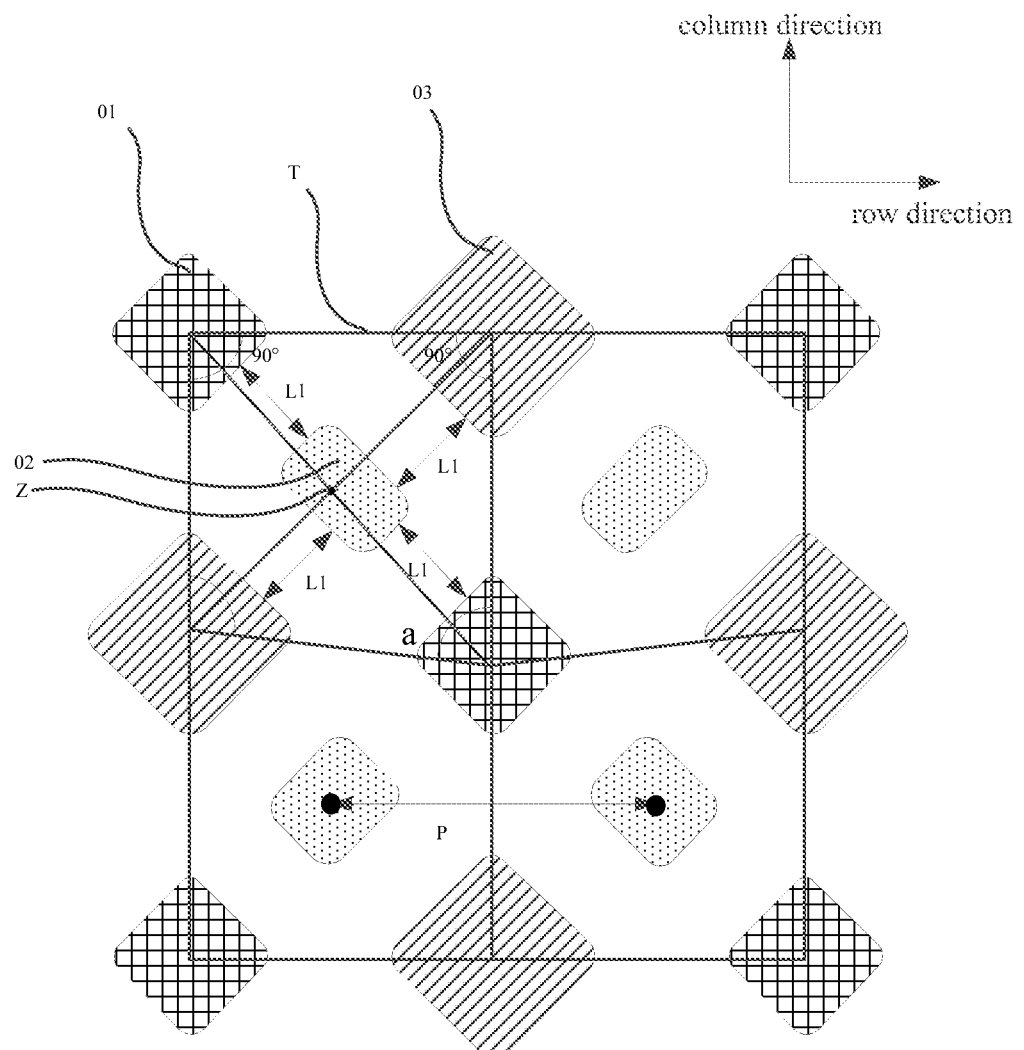
FIGS. 2 to 9 are schematic diagrams of the display substrate according to the embodiments of the present disclosure.

In one embodiment, as shown in FIG. 2, first sub-pixels 01 and third sub-pixels 03 are arranged alternately to form a plurality of first sub-pixel rows, and second sub-pixels 02 form a plurality of second sub-pixel rows. The first sub-pixel rows and the second sub-pixel rows are arranged alternately in the column direction. Connection lines of center points of two first sub-pixels 01 and two third sub-pixels 03 arranged in two adjacent rows and two adjacent columns form a first virtual quadrilateral T (a small solid box in FIG. 2), the two first sub-pixels 01 are located at two vertex angles of the first virtual quadrilateral T which are opposite to each other, the two third sub-pixels 03 are located at the other two vertex angles of the first virtual quadrilateral T which are opposite to each other, and one second sub-pixel 02 is located within the first virtual quadrilateral T. A center point of the second sub-pixel 02 may or may not coincide with a center point Z of the first virtual quadrilateral T. P is a distance between center points of two adjacent second sub-pixels 02 in each second sub-pixel row.

As shown in FIG. 2, in the first virtual quadrilateral T, a connection line of center points of the first sub-pixel 01 and the third sub-pixel 03 adjacent to each other in the column direction is parallel to the column direction. There are two connection lines formed by center points of the first sub-pixels 01 and the third sub-pixels 03 adjacent to each other in the row direction. One of the two connection lines is parallel to the row direction, and the other of the two connection lines is not parallel to the row direction. In this way, the first virtual quadrilateral T is a trapezoid having two right angles. Two interior angles each not being a right angle of the first virtual quadrilateral T include an acute angle a and an obtuse angle (180°−a). In some embodiments, the acute angle a may be 86°. Of course, the acute angle a is not limited to 86°, and may also be adjusted to another value.

As shown in FIG. 2, in each first virtual quadrilateral T, a distance between a side of the second sub-pixel 02 and a side of each of the first sub-pixels 01 adjacent to the second sub-pixel 02 may be L1, and a distance between a side of the second sub-pixel 02 and a side of each of the third sub-pixels 03 adjacent to the second sub-pixel 02 may be L2.

Figure 3:
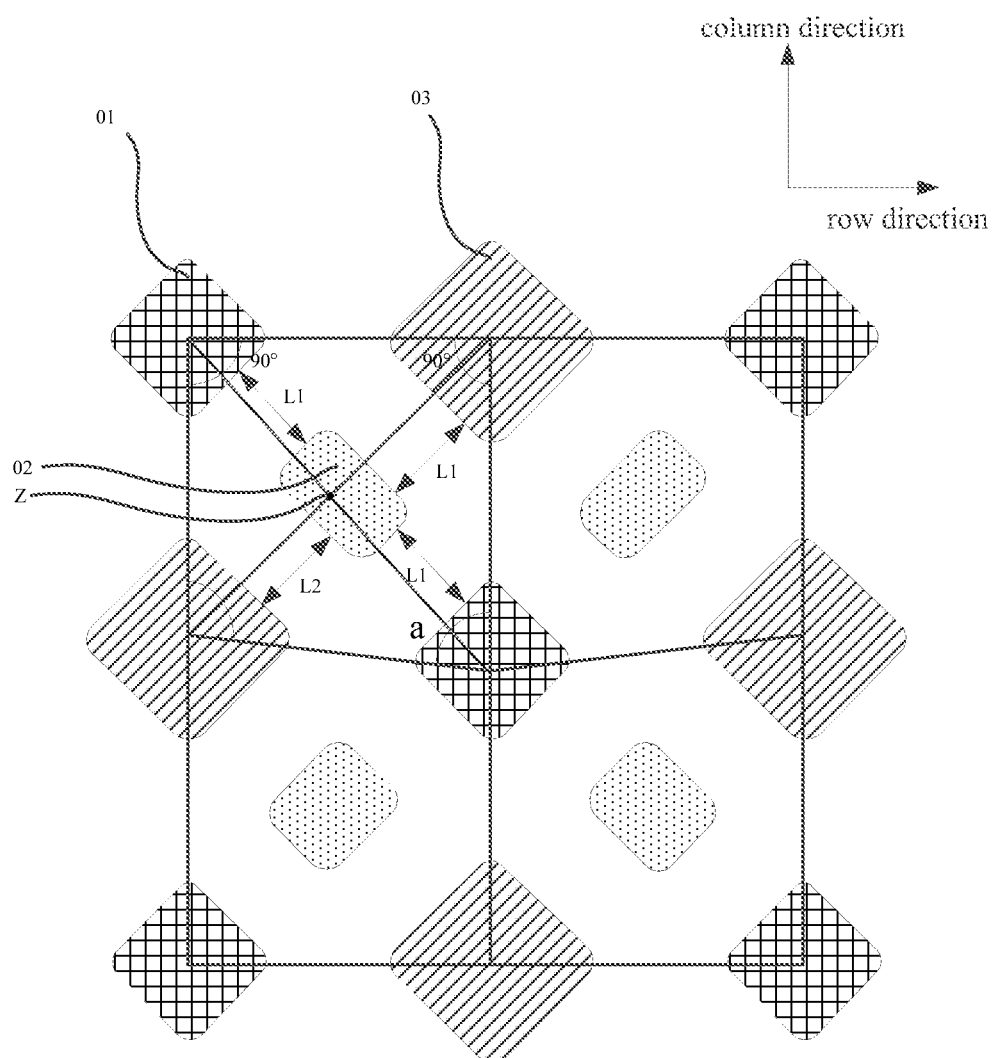

As shown in FIG. 3, in each first virtual quadrilateral T, a distance between a side of the second sub-pixel 02 and a side of each of the first sub-pixels 01 adjacent to the second sub-pixel 02 may be L1, a distance between a side of the second sub-pixel 02 and a side of one third sub-pixel 03 adjacent to the second sub-pixel 02 may be L1, and a distance between a side of the second sub-pixel 02 and a side of the other third sub-pixel 03 adjacent to the second sub-pixel 02 may be L2.

Figure 4:
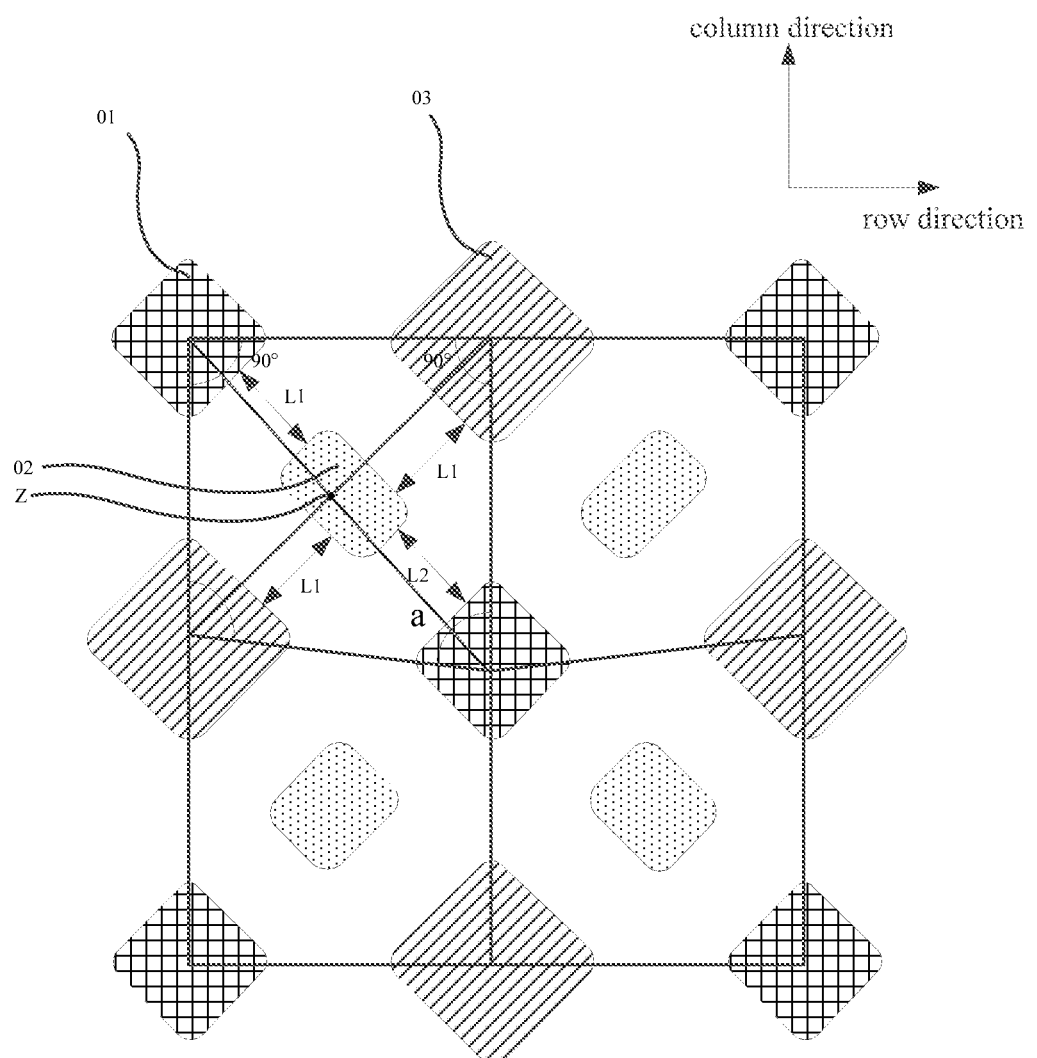

As shown in FIG. 4, in each first virtual quadrilateral T, a distance between a side of the second sub-pixel 02 and a side of each of the third sub-pixels 03 adjacent to the second sub-pixel 02 may be L1, a distance between a side of the second sub-pixel 02 and a side of one first sub-pixel 01 adjacent to the second sub-pixel 02 may be L1, and a distance between a side of the second sub-pixel 02 and a side of the other first sub-pixel 01 adjacent to the second sub-pixel 02 may be L2.

Figure 5:
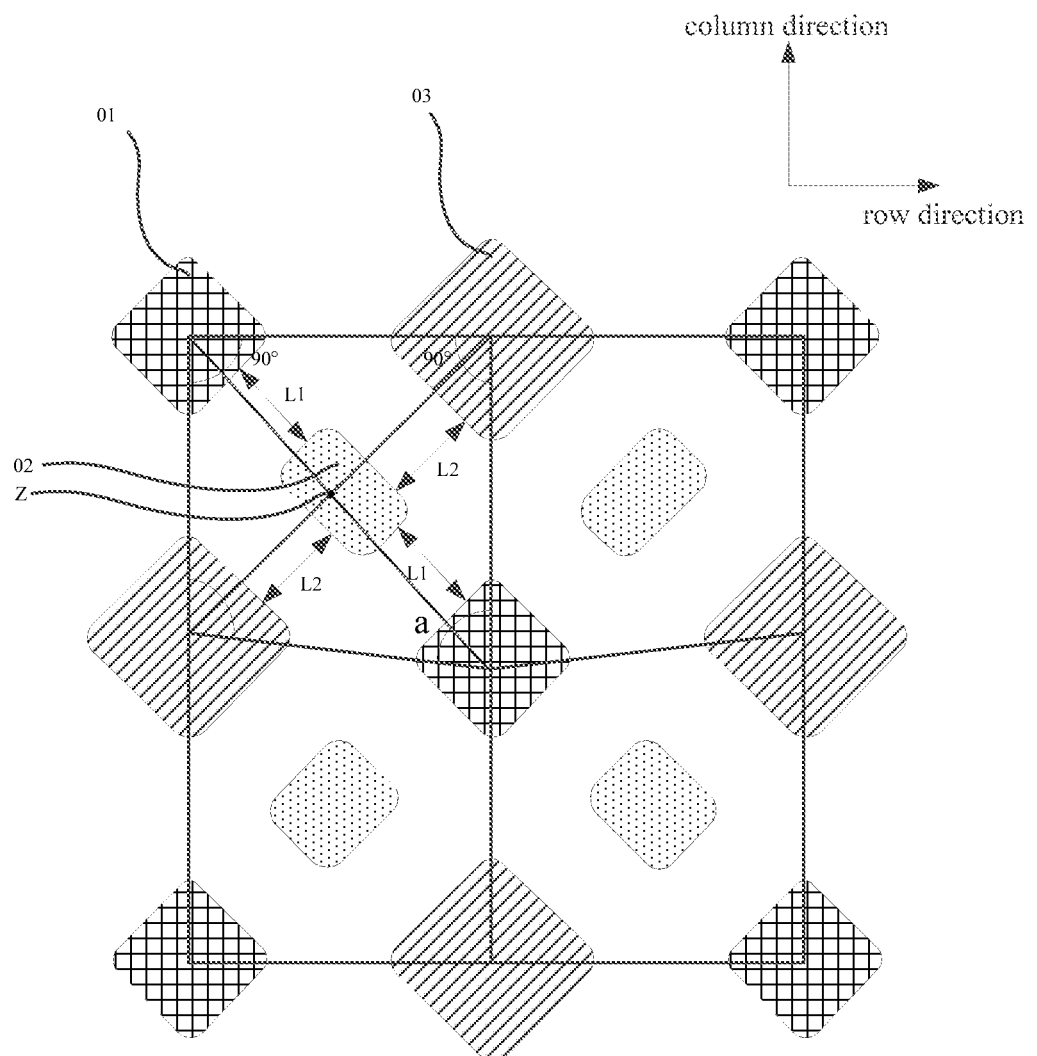

As shown in FIG. 5, in each first virtual quadrilateral T, a distance between a side of the second sub-pixel 02 and a side of each of the first sub-pixels 01 adjacent to the second sub-pixel 02 may be L1, and a distance between a side of the second sub-pixel 02 and a side of each of the third sub-pixels 03 adjacent to the second sub-pixel 02 may be L2.

As shown in FIGS. 2 to 5, the center point of the second sub-pixel 02 is not at an intersection position of two diagonal lines of the first virtual quadrilateral T. Each diagonal line of the first virtual quadrilateral T is a connection line of center points of the first sub-pixel 01 and the third sub-pixel 03 opposite to each other. That is, distances from the center point of the second sub-pixel 02 to the center points of two first sub-pixels 01 adjacent to the second sub-pixel 02 are not equal to each other, and distances from the center point of the second sub-pixel 02 to the center points of two third sub-pixels 03 adjacent to the second sub-pixel 02 are not equal to each other.

The side of the sub-pixel is a side of a light-emitting region of the sub-pixel, and the center point of the sub-pixel is a center point of the light-emitting region of the sub-pixel.

Four adjacent first virtual quadrilaterals T arranged in two columns and two rows form a large virtual polygon (a largest solid box in FIG. 2), i.e., the second virtual polygon. The first sub-pixels 01 are located at a center position and four vertex angles positions of the second virtual polygon, the third sub-pixels 03 are located at midpoint positions of sides of the second virtual polygon, and the second virtual polygon may be a virtual square.

Figure 6:
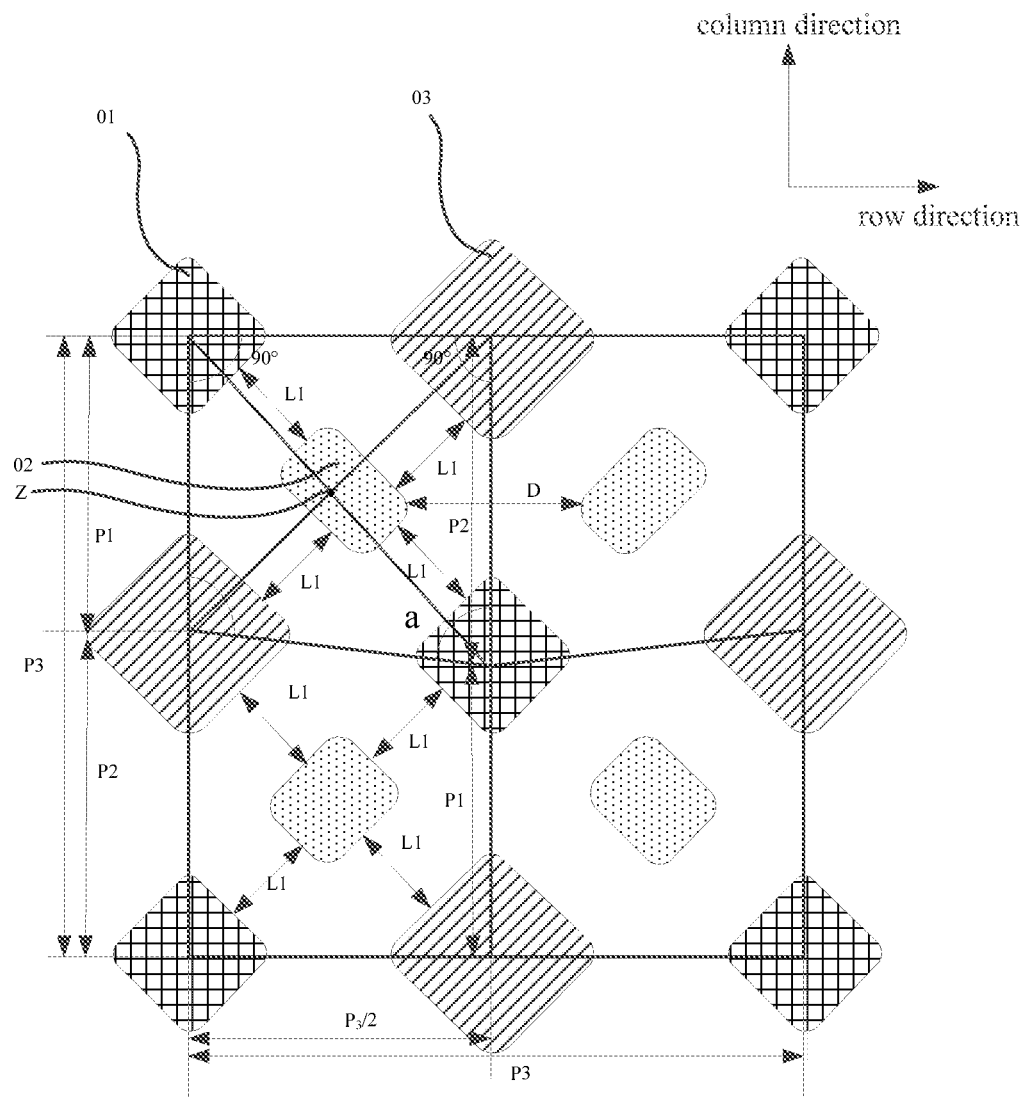

As shown in FIG. 6, a second virtual polygon includes two adjacent first virtual quadrilaterals T in the column direction. A length of a first side of a first virtual quadrilateral T in the column direction is P1, a length of a second side of a second first virtual quadrilateral T in the column direction is P2, the first side and the second side are on a same straight line, P1 is smaller than P2, and P1+P2=P3. A length of a third side of the first virtual quadrilateral T in the column direction is P2, a length of a fourth side of the second first virtual quadrilateral T in the column direction is P1, the third side and the fourth side are on a same straight line, P1 is smaller than P2, and P1+P2=P3. A distance between the center points of the first sub-pixel 01 and the third sub-pixel 03 adjacent to each other in the row direction may be P3/2.

Through the above pixel arrangement, brightness center points 04 of light-emitting pixel points each composed of the first sub-pixel 01, the second sub-pixel 02 and the third sub-pixel 03 may be distributed more evenly, so as to improve the display effect.

In addition, as shown in FIGS. 2 to 6, the second sub-pixels 02 are arranged in a staggered manner with respect to the first sub-pixels and the third sub-pixels, so as to increase a margin when manufacturing a metal mask. In this way, a distance D between openings (corresponding to a smallest solid box surrounding the second sub-pixel 02) on a mask for manufacturing the second sub-pixels 02 is increased under a same aperture ratio, so as to increase the margin when manufacturing the metal mask, thereby to achieve a higher resolution.

As shown in FIG. 6, the second virtual polygon includes the two adjacent first virtual quadrilaterals T in the column direction. In the first virtual quadrilateral T, a distance between a side of the second sub-pixel 02 and a side of each of the first sub-pixels 01 or the third sub-pixels 03 adjacent to the second sub-pixel 02 may be L1. In the second first virtual quadrilateral T, a distance between a side of the second sub-pixel 02 and a side of each of the first sub-pixels 01 or the third sub-pixels 03 adjacent to the second sub-pixel 02 may be L1. The second sub-pixel 02 in the first virtual quadrilateral T has a different shape from the second sub-pixel 02 in the second first virtual quadrilateral T, and has a same area as the second sub-pixel 02 in the second first virtual quadrilateral T.

Figure 7:
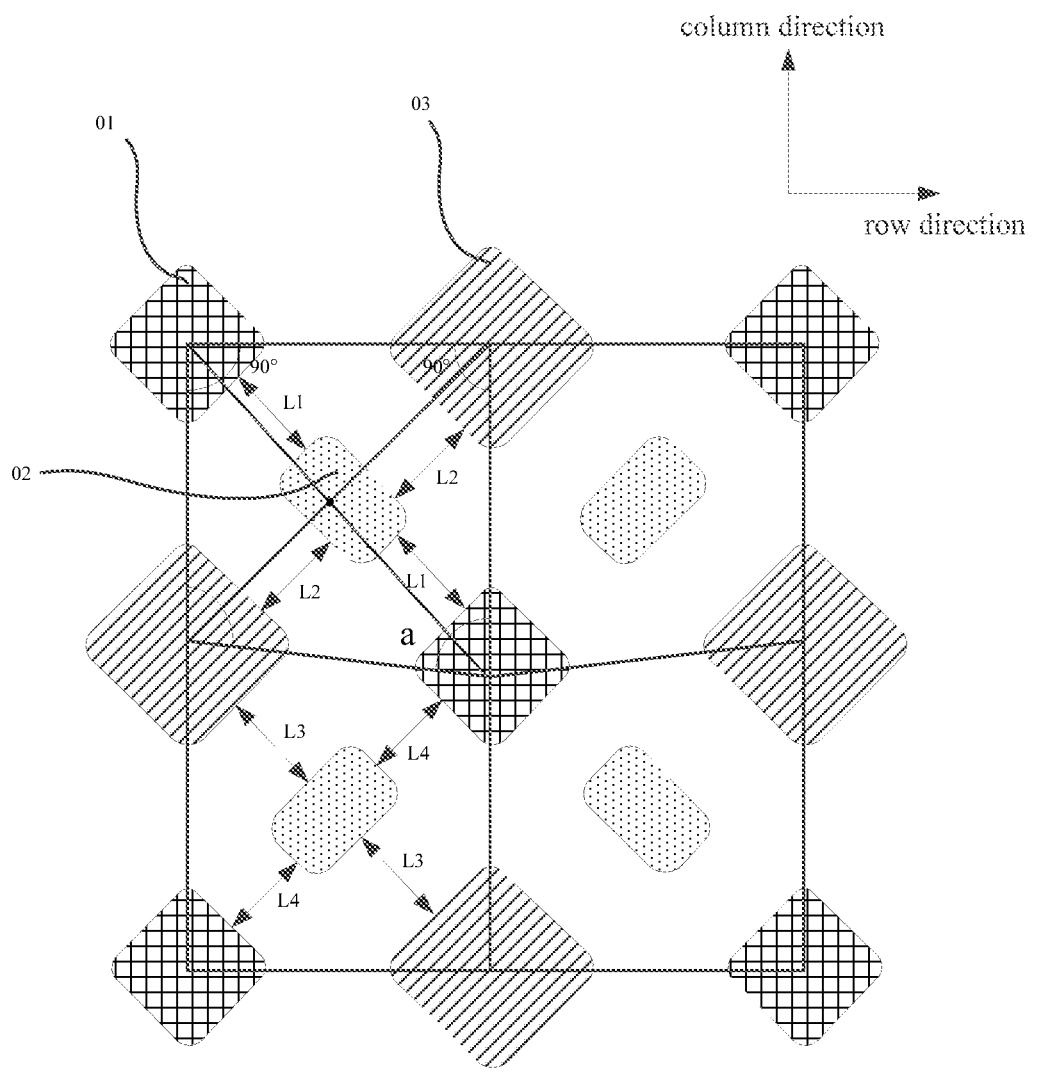

As shown in FIG. 7, a second virtual polygon includes two adjacent first virtual quadrilaterals T in the column direction. In a first virtual quadrilateral T, a distance between a side of the second sub-pixel 02 and a side of each of the first sub-pixels 01 adjacent to the second sub-pixel 02 may be L1, and a distance between a side of the second sub-pixel 02 and a side of each of the third sub-pixels 03 adjacent to the second sub-pixel 02 may be L2. In a second first virtual quadrilateral T, a distance between a side of the second sub-pixel 02 and a side of each of the first sub-pixels 01 adjacent to the second sub-pixel 02 may be L3, and a distance between a side of the second sub-pixel 02 and a side of each of the third sub-pixels 03 adjacent to the second sub-pixel 02 may be L4. L1 may be equal to L3, and L2 may be equal to L4, so that the two second sub-pixels 02 in the two adjacent first virtual quadrilaterals T respectively in the column direction have the same shape.

Figure 8:
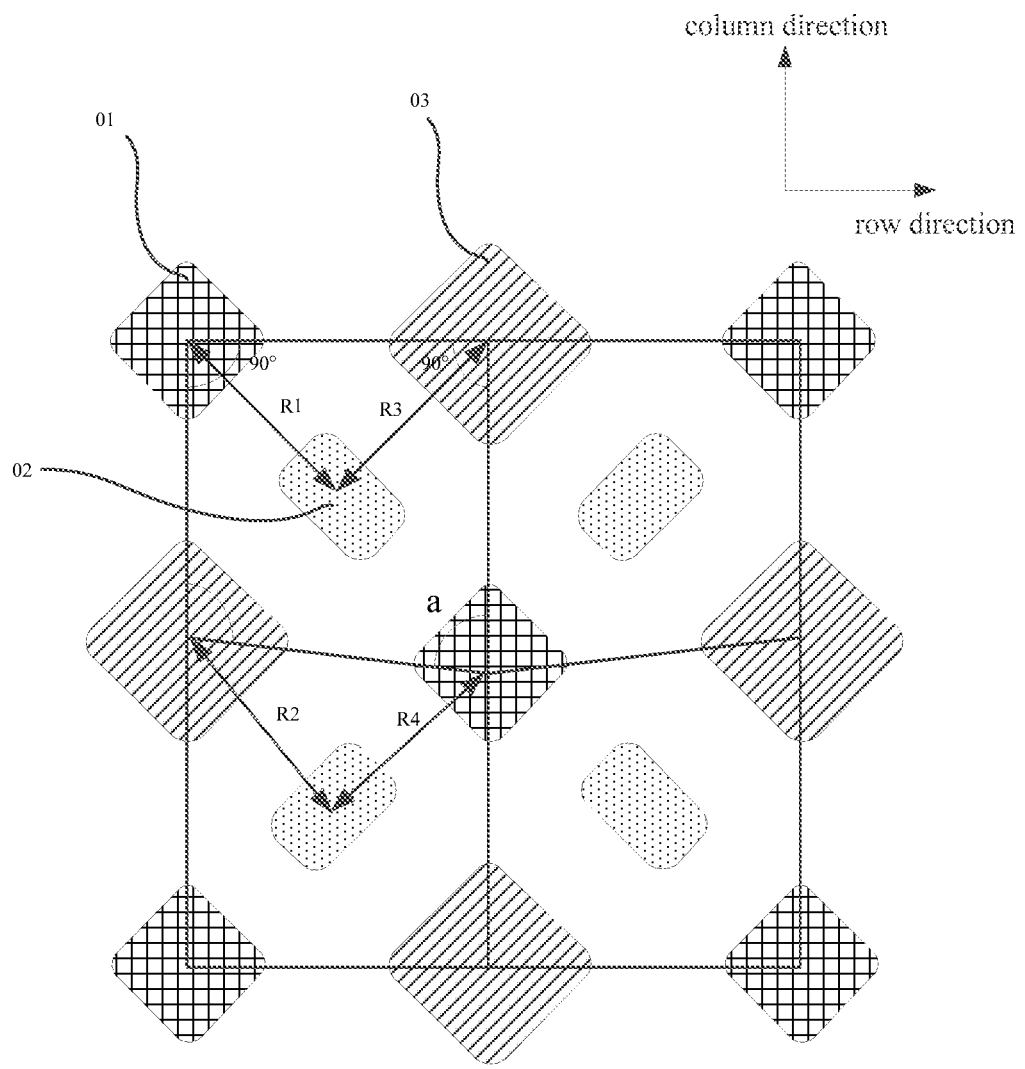

As shown in FIG. 8, a second virtual polygon includes two adjacent first virtual quadrilaterals T in the column direction. In a first virtual quadrilateral T, a distance between a side of the second sub-pixel 02 and a side of each of the first sub-pixels 01 adjacent to the second sub-pixel 02 may be R1, and a distance between a side of the second sub-pixel 02 and a side of each of the third sub-pixels 03 adjacent to the second sub-pixel 02 may be R3. In a second first virtual quadrilateral T, a distance between a side of the second sub-pixel 02 and a side of each of the first sub-pixels 01 adjacent to the second sub-pixel 02 may be R2, and a distance between a side of the second sub-pixel 02 and a side of each of the third sub-pixels 03 adjacent to the second sub-pixel 02 may be R4. R1 may be not equal to R2, and R3 may be not equal to R4.

In the embodiment, values of the acute angles a in the two adjacent first virtual quadrilaterals T in the column direction may be equal to each other, and positions thereof are not adjacent to each other in the column direction. Values of the acute angles a in the two adjacent first virtual quadrilaterals T in the row direction may be equal to each other.

As shown in FIGS. 2 to 8, the second virtual polygon includes two adjacent first virtual quadrilaterals T in the column direction. In the first virtual quadrilateral T, a length of a connection line of the center points of two first sub-pixels 01 opposite to each other is larger than a length of a connection line of the center points of two third sub-pixels 03 opposite to each other. In the second first virtual quadrilateral T, a length of a connection line of the center points of two third sub-pixels 03 opposite to each other is larger than a length of a connection line of the center points of two first sub-pixels 01 opposite to each other.

Figure 9:
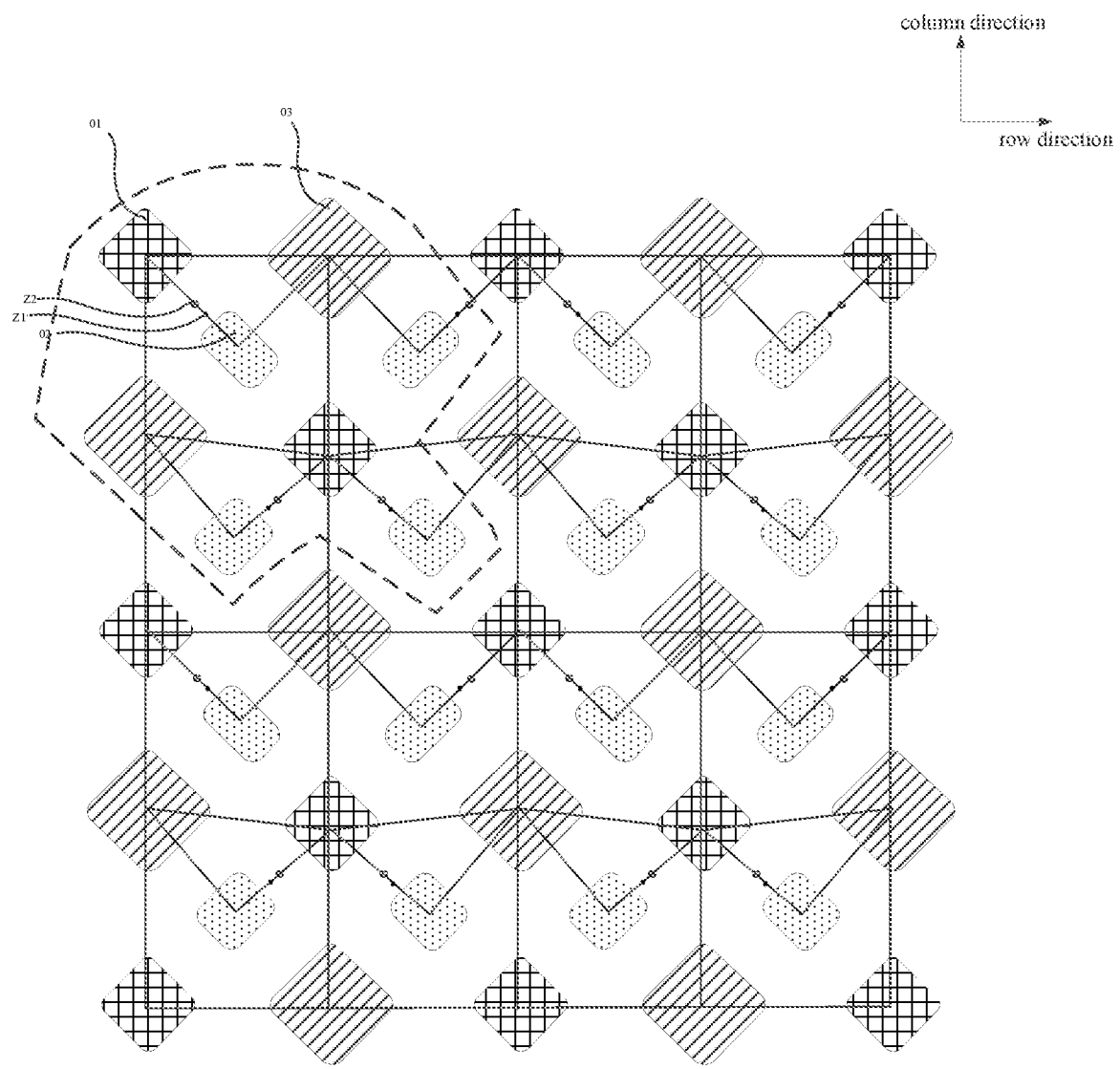

As shown in FIG. 9, in the column direction, connection lines of the second sub-pixels 02 are not on a same straight line, so as to form a more even distribution of brightness center points of synthesized white points, thereby to improve the display effect of the display device. As shown in FIG. 9, Z1 denotes a brightness center point of a white point of the display substrate in the embodiment, and Z2 denotes a brightness center point of a white point of a conventional display substrate. In the two adjacent first virtual quadrilaterals T in the column direction, a position of the brightness center point of the white point in the first virtual quadrilateral T is offset downward to the right, a position of the brightness center point of the white point in the second first virtual quadrilateral T is offset downward to the left, so as to enable a brightness center point of a synthesized white point of every two adjacent first virtual quadrilaterals T in the column direction to close to a same straight line. As compared with the solution in the related art, the brightness center points of white points of the display substrate in the embodiment are distributed in a more even manner, so as to provide a better display effect.

As shown in FIG. 9, sub-pixels in a dashed box form one pixel repetition unit, which includes two first sub-pixels 01 and two third sub-pixels 03 located in the same first virtual quadrilateral, and four second sub-pixels 02 located in the same second virtual polygon as one of the two first sub-pixels 01 and surrounding the one of the two first sub-pixels 01.

In the embodiment, each first sub-pixel 01 has a same shape, each third sub-pixel 03 has a same shape, and the first sub-pixel 01 has the same shape as the third sub-pixel 03.

Based on a same invention concept, an organic electroluminescence display panel including the above-mentioned display substrate is further provided in the embodiments of the present disclosure. The display substrate may be the display substrate according to any one of the above-mentioned embodiments of the present disclosure. The adjacent first virtual quadrilaterals are arranged in the row direction and the column direction with shared sides. That is, two adjacent display substrates share the first sub-pixel 01 and the third sub-pixel 03 located on a side shared by adjacent first virtual quadrilaterals. Since a principle used to solve the problems in the organic electroluminescent display panel is similar to that in the above-mentioned display substrate, the organic electroluminescent display panel may be implemented through referring to the embodiments about the pixel arrangement structure, and thus is described in a simple manner.

The adjacent first virtual quadrilaterals are arranged in the row direction and the column direction with shared sides. That is, two adjacent first virtual quadrilaterals in the row direction share one side in the column direction, and two adjacent first virtual quadrilaterals in the column direction share one side in the row direction.

When the adjacent first virtual quadrilaterals share the side, one side of the two adjacent first virtual quadrilaterals may be the same, but shapes of the two adjacent first virtual quadrilaterals may be different from each other, for example, interior angles thereof may be different from each other.

In some embodiments, the organic electroluminescent display panel further includes a pixel definition layer, the pixel definition layer includes a plurality of pixel definition layer openings, each of the first sub-pixels, the second sub-pixels and the third sub-pixels corresponds to one pixel definition layer opening, and each of the first sub-pixels, the second sub-pixels and the third sub-pixels has an approximately same shape as the corresponding pixel definition layer opening.

In some embodiments, each first sub-pixel includes multiple film layers, and the multiple film layers of the first sub-pixel at least partially cover a region outside the corresponding pixel definition layer opening; and/or, each second sub-pixel includes multiple film layers, and the multiple film layers of the second sub-pixel at least partially cover a region outside the corresponding pixel definition layer opening; and/or, each third sub-pixel includes multiple film layers, and the multiple film layers of the third sub-pixel at least partially cover a region outside the corresponding pixel definition layer opening.

In some embodiments, at least part of the pixel definition layer openings have different shapes or different areas.

In some embodiments, at least part of the pixel definition layer openings corresponding to the second sub-pixels have different shapes or different areas.

In some embodiments, smallest distances from the at least part of the pixel definition layer openings corresponding to the second sub-pixels to adjacent openings are different from each other.

Based on the same invention concept, a display device is further provided in the embodiments of the present disclosure. The display device may include the organic electroluminescence display panel according to any one of the above-mentioned embodiments of the present disclosure. The display device may be any product or member having a display function, e.g., a mobile phone, a tablet computer, a television, a display, a laptop computer, a digital photo frame or a navigator. The display device may be implemented through referring to the embodiments about the organic electroluminescence display panel, and thus is described in a simple manner.

Based on the same invention concept, a high-precision metal mask is further provided in the embodiments of the present disclosure. The high-precision metal mask is used for manufacturing the display substrate according to any one of the above-mentioned embodiments of the present disclosure, and includes a plurality of opening regions. The plurality of opening regions include a first opening region corresponding to a position of each first sub-pixel, a second opening region corresponding to a position of each second sub-pixel, and a third opening region corresponding to a position of each third sub-pixel. Since a principle used to solve the problems in the high-precision metal mask is similar to that in the above-mentioned display substrate, the high-precision metal mask may be implemented through referring to the embodiments about the display substrate, and thus is described in a simple manner.

In some embodiments, each first sub-pixel includes multiple film layers, each second sub-pixel includes multiple film layers, each third sub-pixel includes multiple film layers, a shape and an arrangement of the first opening region are approximately the same with a shape and an arrangement of at least one film layer in the first sub-pixel respectively, a shape and an arrangement of the third opening region are approximately the same with a shape and an arrangement of at least one film layer in the third sub-pixel respectively, and a shape and an arrangement of the second opening region are approximately the same with a shape and an arrangement of at least one film layer in the second sub-pixel respectively.

In some embodiments, at least two of the plurality of second opening regions corresponding to positions of the second sub-pixels in the high-precision metal mask each has a different shape or a different area from the other second opening regions.

Optionally, in the high-precision metal mask of the embodiments of the present disclosure, a distance between adjacent second opening regions is larger than or equal to a process limit distance, so as to meet requirements on the process.

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

It should be further appreciated that, the above embodiments have been described in a progressive manner, and the same or similar contents in the embodiments have not been repeated, i.e., each embodiment has merely focused on the difference from the others. Especially, the product embodiments are substantially similar to the method embodiments, and thus have been described in a simple manner.

Unless otherwise defined, any technical or scientific term used herein shall have the common meaning understood by a person of ordinary skills. Such words as "first" and "second" used in the specification and claims are merely used to differentiate different components rather than to represent any order, number or importance. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above are merely specific embodiments of the present disclosure, but a protection scope of the present disclosure is not limited thereto. Any modifications or replacements that would easily occurred to a person skilled in the art, without departing from the technical scope disclosed in the disclosure, should be encompassed in the protection scope of the present disclosure. Therefore, the protection scope of the present disclosure shall be subject to the protection scope of the claims.

What is claimed is:

1. A display substrate, comprising a plurality of first sub-pixels, a plurality of second sub-pixels and a plurality of third sub-pixels, wherein
   in a first direction, the first sub-pixels and the third sub-pixels are arranged alternately to form a plurality of first sub-pixel rows, the second sub-pixels form a plurality of second sub-pixel rows, the first sub-pixel rows and the second sub-pixel rows are arranged alternately in a second direction, connection lines of center points of two first sub-pixels and two third sub-pixels arranged in two adjacent rows and two adjacent columns form a first virtual quadrilateral, the two first sub-pixels are located at two vertex angles of the first virtual quadrilateral which are opposite to each other, one second sub-pixel is located within the first virtual quadrilateral, the first virtual quadrilateral comprises two interior angles each being equal to 90° and two interior angles each being not equal to 90°, and the two interior angles each being not equal to 90° comprise a first interior angle and a second interior angle;
   in a same first virtual quadrilateral, a distance between a center point of a first sub-pixel located at the first interior angle and a center point of a third sub-pixel located at the second interior angle on a first straight line is x, the first straight line is perpendicular to a common side of the two interior angles each being equal to 90°, a value range of the first interior angle a is (h−10°, h+10°), and h is calculated through one of the following formulas:

$$h = 90° - \arctan\left(\frac{x}{P}\right);$$

$$h = 90° + \arctan\left(\frac{x}{P}\right);$$

wherein P is a distance between center points of two adjacent second sub-pixels in each second sub-pixel row.

2. The display substrate according to claim 1, wherein x ranges from 11 μm to 10 μm.

3. The display substrate according to claim 1, wherein the first interior angle a is larger than or equal to 70° and smaller than 90°.

4. The display substrate according to claim 1, wherein a connection line of center points of two adjacent first sub-pixels in the first direction is parallel to the first direction, a connection line of center points of two adjacent third sub-pixels in the first direction is parallel to the first direction, and a connection line of center points of the first sub-pixel and the third sub-pixel adjacent to each other in the second direction is parallel to the second direction.

5. The display substrate according to claim 4, wherein a distance between the two adjacent first sub-pixels in the first direction is equal to a distance between two adjacent first sub-pixels in the second direction; and/or a distance between the two adjacent third sub-pixels in the first direction is equal to a distance between two adjacent third sub-pixels in the second direction.

6. The display substrate according to claim 1, wherein the first direction is approximately perpendicular to the second direction, the first direction is one of a row direction and a column direction, and the second direction is the other of the row direction and the column direction.

7. The display substrate according to claim 1, wherein four first virtual quadrilaterals arranged in two columns and two rows form a second virtual polygon with shared sides, the second virtual polygon comprises four second sub-pixels, five first sub-pixels and four third sub-pixels, the four second sub-pixels are located within the four first virtual quadrilaterals respectively, one of the five first sub-pixels is surrounded by the other four first sub-pixels, the other four first sub-pixels and the four third sub-pixels are located on sides or vertex angles of the second virtual polygon respectively, and along the sides of the second virtual polygon in both a clockwise sequence and a counterclockwise sequence, the other four first sub-pixels and the four third sub-pixels located on the sides or vertex angles of the second virtual polygon respectively are arranged alternately; or
   the second virtual polygon comprises four second sub-pixels, five third sub-pixels and four first sub-pixels, the four second sub-pixels are located within the four first virtual quadrilaterals respectively, one of the five third sub-pixels is surrounded by the other four third sub-pixels, the other four third sub-pixels and the four first sub-pixels are located on sides or vertex angles of the second virtual polygon respectively, and along the sides of the second virtual polygon in both a clockwise sequence and a counterclockwise sequence, the other four third sub-pixels and the four first sub-pixels located on the sides or vertex angles of the second virtual polygon respectively are arranged alternately.

8. The display substrate according to claim 7, wherein a center point of the first sub-pixel surrounded by the other four first sub-pixels does not coincide with a center point of a quadrilateral formed by the other four first sub-pixels, a center point of the third sub-pixel surrounded by the other four third sub-pixels does not coincide with a center point of a quadrilateral formed by the other four third sub-pixels.

9. The display substrate according to claim 7, further comprising a plurality of pixel repetition units, each pixel repetition unit comprises two first sub-pixels and two third sub-pixels located in the same first virtual quadrilateral, and four second sub-pixels located in a same second virtual polygon as one of the two first sub-pixels and surrounding the one of the two first sub-pixels.

10. The display substrate according to claim 7, wherein the second virtual polygon is a rectangle.

11. The display substrate according to claim 1, wherein a connection line of center points of at least part of the second sub-pixels arranged in the first direction is approximately parallel to the first direction, and a connection line of center points of at least part of the second sub-pixels arranged in the second direction is approximately parallel to the second direction.

12. The display substrate according to claim 1, wherein each of the second sub-pixels has a same shape and a same area.

13. The display substrate according to claim 1, wherein, in at least one first virtual quadrilateral, a distance between the second sub-pixel and one of the two third sub-pixels is L1, a distance between the second sub-pixel and the other of the two third sub-pixels is L2, and a distance between the second sub-pixel and each of the two first sub-pixels is L1; or
   in at least one first virtual quadrilateral, a distance between the second sub-pixel and each of the two third sub-pixels and a distance between the second sub-pixel and each of the two first sub-pixels are L1; or
   in at least one first virtual quadrilateral, a distance between the second sub-pixel and each of the two third sub-pixels is L1, a distance between the second sub-pixel and one of the two first sub-pixels is L1, and a distance between the second sub-pixel and the other of the two first sub-pixels is L2, or
   in at least one first virtual quadrilateral, a distance between the second sub-pixel and each of the two third sub-pixels is L2, and a distance between the second sub-pixel and each of the two first sub-pixels is L1;
   wherein L2 is larger than L1, and a spacing between sub-pixels is a minimum distance between sides of the sub-pixels.

14. The display substrate according to claim 1, wherein, in at least one first virtual quadrilateral, a center point of the second sub-pixel does not coincide with a center point of the first virtual quadrilateral.

15. The display substrate according to claim 1, wherein an angle between a connection line of two adjacent second sub-pixels in the second direction and the second direction is larger than or equal to 0° and smaller than 90°.

16. The display substrate according to claim 1, wherein two adjacent first virtual quadrilaterals in the second direction comprise a first virtual quadrilateral A and a first virtual quadrilateral B,
   in the first virtual quadrilateral A, a distance between a center point of the second sub-pixel and a center point of the first sub-pixel adjacent to the second sub-pixel is R1, and a distance between the center point of the second sub-pixel and a center point of the third sub-pixel adjacent to the second sub-pixel is R3;
   in the first virtual quadrilateral B, a distance between a center point of the second sub-pixel and a center point of the first sub-pixel adjacent to the second sub-pixel is R2, and a distance between the center point of the second sub-pixel and a center point of the third sub-pixel adjacent to the second sub-pixel is R4;
   wherein R1 is not equal to R2, and/or, R3 is not equal to R4.

17. The display substrate according to claim 1, wherein two adjacent first virtual quadrilaterals in the second direction comprise a first virtual quadrilateral A and a first virtual quadrilateral B, the first virtual quadrilateral A comprises a first side and a third side that are parallel to the second direction, the first virtual quadrilateral B comprises a second side and a fourth side that are parallel to the second direction, the first side and the second side are on a same straight line, the third side and the fourth side are on a same straight line, a length of the first side is smaller than a length of the second side, a length of the fourth side is smaller than a length of the third side, the length of the first side is equal to the length of the fourth side, and the length of the second side is equal to the length of the third side.

18. An organic electroluminescence display panel, comprising the display substrate according to claim 1.

19. A display device, comprising the organic electroluminescence display panel according to claim 18.

20. A high-precision metal mask for manufacturing the display substrate according to claim 1, comprising: a plurality of opening regions, wherein the plurality of opening regions comprise a first opening region corresponding to a position of each first sub-pixel, a second opening region corresponding to a position of each second sub-pixel, and a third opening region corresponding to a position of each third sub-pixel.

\* \* \* \* \*